United States Patent [19]

Ina

[11] Patent Number: 5,659,384
[45] Date of Patent: Aug. 19, 1997

[54] POSITION DETECTION APPARATUS AND METHOD

[75] Inventor: Hideki Ina, Utsunomiya, Japan

[73] Assignee: Canon Kabushiki Kaisha, Tokyo, Japan

[21] Appl. No.: 735,823

[22] Filed: Oct. 23, 1996

Related U.S. Application Data

[63] Continuation of Ser. No. 223,853, Apr. 6, 1994, abandoned.

[30] Foreign Application Priority Data

| Apr. 9, 1993 | [JP] | Japan | 5-107474 |
| Apr. 27, 1993 | [JP] | Japan | 5-101032 |

[51] Int. Cl.$^6$ .................................................. G03B 27/42
[52] U.S. Cl. .................................................. 355/53; 355/56
[58] Field of Search .................................................. 355/53, 56

[56] References Cited

U.S. PATENT DOCUMENTS

| 4,669,883 | 6/1987 | Ina et al. | 356/401 |
| 4,834,540 | 5/1989 | Totsuka et al. | 356/401 |
| 4,844,617 | 7/1989 | Kelderman et al. | 356/372 |
| 4,861,162 | 8/1989 | Ina | 356/401 |
| 4,886,974 | 12/1989 | Ina | 250/561 |
| 4,901,109 | 2/1990 | Mitome et al. | 355/68 |
| 4,992,825 | 2/1991 | Fukada et al. | 355/53 |
| 5,007,805 | 4/1991 | Carle et al. | 359/235 |
| 5,065,008 | 11/1991 | Hakamata et al. | 250/216 |
| 5,131,748 | 7/1992 | Monchalin et al. | 356/349 |
| 5,162,941 | 11/1992 | Favor et al. | 359/386 |
| 5,192,980 | 3/1993 | Dixon et al. | 356/326 |
| 5,194,843 | 3/1993 | Nishi | 355/53 |
| 5,248,876 | 9/1993 | Keroting et al. | 350/561 |
| 5,255,050 | 10/1993 | Kitagawa | 355/53 |
| 5,270,771 | 12/1993 | Sato | 355/53 |
| 5,309,197 | 5/1994 | Mori et al. | 355/53 |
| 5,321,446 | 6/1994 | Massig et al. | 351/214 |

FOREIGN PATENT DOCUMENTS 3-61802  3/1991  Japan.

*Primary Examiner*—Daniel P. Malley
*Attorney, Agent, or Firm*—Fitzpatrick, Cella, Harper & Scinto

[57] ABSTRACT

Apparatus and method for detecting a position of a flat object includes structure and process steps for providing marks having at least one of (i) projections and (ii) recesses on a surface of a flat object. Structure and steps are provided for detecting the position of a surface of the object in a direction perpendicular to the surface of the object. Structure and steps are also provided for determining the position of a predetermined plane parallel to the surface of the object based on the detected position of the object surface. Structure and steps are also provided for detecting the positions of the marks within the predetermined plane.

30 Claims, 27 Drawing Sheets

$$\frac{TOC_A + TOC}{2} - TOC_B = \Delta$$

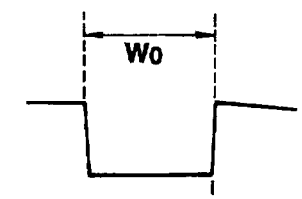
FIG.18(A)
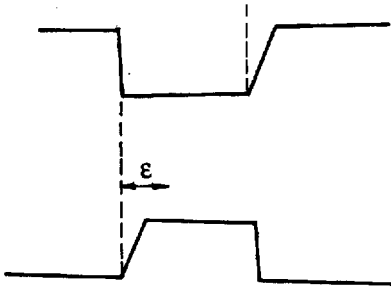
FIG.18(B)
FIG.18(C)
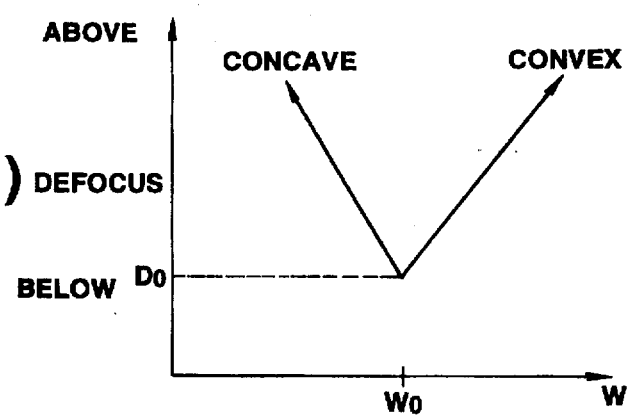
FIG.18(D)
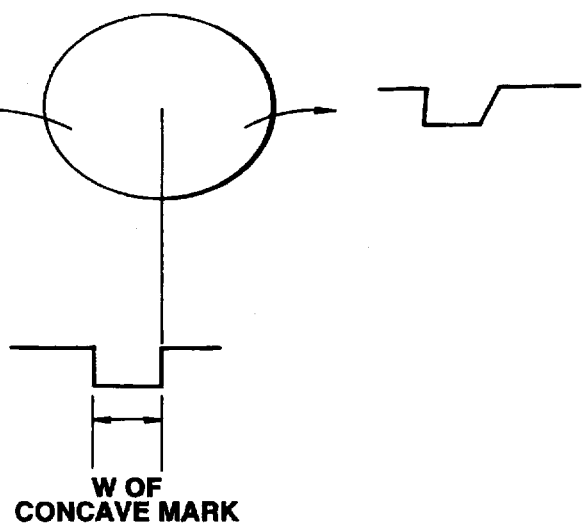
FIG.18(E)

MANUFACTURE FLOW OF
SEMICONDUCTOR DEVICES

WAFER PROCESS

POSITION DETECTION APPARATUS AND METHOD

This application is a continuation of application Ser. No. 08/223,853, filed Apr. 6, 1994, now abandoned.

BACKGROUND OF THE INVENTION

1. Field of the Invention

This invention relates to a position detection apparatus and a semiconductor-device manufacturing method using the apparatus. The apparatus and method will be used, for example, when projecting an electronic-circuit pattern formed on the surface of a first object (such as a reticle or the like) onto the surface of a second object (such as a wafer or the like) in a projection exposure apparatus (a stepper) for manufacturing semiconductor devices, and performing relative positioning (position detection) between the reticle and the wafer when performing an exposure transfer.

2. Description of the Related Art

In a projection exposure apparatus for manufacturing semiconductor devices, relative positioning between a reticle and a wafer is an important factor for providing high-precision devices.

Recently, in particular, submicrometer accuracy in positioning has been requested in accordance with the need for semiconductor devices having a high degree of integration.

As one of the methods for performing relative position detection (alignment) between a reticle and a wafer, there is a TTL (through the lens) method, in which the position detection is performed through a projection lens.

Various kinds of position detection apparatuses of this method have been proposed, in which relative position detection between reference positions (reference marks) on a predetermined surface and alignment marks provided on the surface of a wafer is performed using a light beam having a wavelength different from that of the exposure light used when illuminating a pattern on the surface of a reticle to print the pattern on the surface of the wafer.

The assignee of the present application has proposed, for example, in Japanese Patent Application No. 1-198261 (1989), an observation method and an observation apparatus in which high-precision position detection can be performed while observing an alignment-mark image on a predetermined surface, for example, the surface of image pickup means (such as a CCD (charge-coupled device) camera or the like) using the image pickup means.

If the wavelength width of the light beam used in a position detection apparatus is narrow, when, for example, observing alignment marks on the surface of a wafer on which a resist is coated, many interference fringes are generated caused by light reflected by the surface of the resist and the surface of the wafer, thereby causing an error in detection.

In order to reduce such interference fringes, projection exposure apparatuses have been proposed, in which alignment marks are observed using a light source emitting a polychromatic light beam having a large spectral width whose half-width is about several tens of nanometers.

Conventional position detection apparatuses have the problem that it is difficult to identify the exact position being detected on an alignment mark on the surface of a wafer due to the relationship between the optical depth of field of the detection optical system and the form of the alignment mark produced by a given process. This problem is one of the factors which reduces accuracy in position detection.

The cause of this problem will now be described with reference to the accompanying drawings.

FIG. 1 is a schematic cross-sectional view of an alignment mark.

In FIG. 1, for the purpose of simplification, a case is illustrated in which the alignment mark is formed by etching a silicon (Si) wafer, and a photoresist (PR) is coated on the surface of the wafer.

When focusing the wafer surface onto the surface of an image pickup device, such as a CCD or the like, by a detection optical system, if it is assumed, for example, that the wavelength $\lambda$ of the light beam being used is 632.8 nm, and the numerical aperture of the system on the wafer surface is NA=0.5, the optical depth of field expressed by $\pm \lambda/(2\ NA^2)$ becomes $\pm 1.3$ μm (having a range of 2.5 μm).

In most of the current semiconductor manufacturing processes, both the step d of the alignment mark and the thickness T of the resist equal at least about 1 μm.

As shown in FIG. 1, illuminating light produces various kinds of reflected light, such as reflected light L1 reflected by the photoresist surface PRF, refracted light L2 deflected by being refracted at an inclined portion of photoresist PR, scattered light L3 scattered at an edge portion of the alignment mark, and the like. An alignment-mark image is formed on the surface of the image pickup device of the CCD camera by all of such reflected light.

If the refractive index of photoresist PR is represented by N, the geometrical optical length equals L+d/N, which is the same order as the optical depth of field.

The alignment-mark image on the surface of the image pickup device is formed by reflected light from the photoresist surface PRF and reflected light from the wafer surface. Hence, it is impossible to identify the surface being detected.

FIG. 2 illustrates a case in which the shape of the cross-section of an alignment mark becomes asymmetrical due to the wafer-forming process.

As described above, the detection optical system detects reflected light from all surfaces, i.e., the photoresist surface PRF, the wafer's top surface WF and the wafer's bottom surface WB, without discriminating among respective light beams. Hence, it is impossible to focus the system on the wafer's bottom surface WB if it is desired to do so.

FIG. 3 illustrates a case in which multiple transparent layers are provided on the wafer surface in the process.

An alignment mark LOCOS is formed by a local oxidation of silicon process, and a PSG (phosphosilicate glass) layer is formed thereon. At that time, if the shape of the cross-section of the structure becomes asymmetrical due to inferior coverage of the PSG layer, the obtained image signal becomes asymmetrical. Hence, even if the LOCOS mark is symmetrical (having no error) and it is desired to perform alignment with the LOCOS mark, accuracy in detection is reduced due to the asymmetry of the PSG layer.

If photoresist PR is coated in an inferior manner, the photoresist PR becomes asymmetrical in the vicinity of the alignment mark even if the lower portion of the alignment mark is symmetrical, as shown in FIG. 4(A). Hence, the waveform of the video signal $OS_v$ from the image pickup means becomes asymmetrical, as shown in FIG. 4(B).

As a result, accuracy in position detection of the alignment mark is reduced as in the above-described cases. The waveform of the video signal becomes asymmetrical due to various factors, such as asymmetry in the pattern on the wafer, in a transparent or translucent film provided thereon, in a resist, and the like. These factors cannot be neglected when high accuracy in positioning is required.

SUMMARY OF THE INVENTION

It is an object of the present invention to provide a position detection apparatus and a semiconductor-device manufacturing method using the apparatus, in which accuracy in detection due to variations in the production process is improved by detecting, for example, only positional information relating to the base of a wafer on which a transparent film is formed, or only positional information relating to a transparent LOCOS mark formed on the wafer.

According to one aspect, the present invention which achieves the above-described object relates to a position detection apparatus for detecting a position of a flat object, comprising marks having projections and recesses formed on a surface of the object, first position detection means for detecting the position of the surface of the object in a direction perpendicular to the surface of the object, means for determining a predetermined surface parallel to the surface of the object based on the position of the surface of the object obtained from the first position detection means, and second position detection means for detecting the positions of the marks within the predetermined surface.

In one embodiment, the second position detection means comprises a confocal optical system, which observes the images of the marks within the predetermined surface. A field stop of the confocal optical system and the predetermined surface are optically conjugate with each other.

In another embodiment, the field stop has the shape of a slit extending in a direction orthogonal to the direction of position detection of the marks. The field stop and the object perform relative movement in the direction of position detection of the marks.

In still another embodiment, the field stop comprises a liquid-crystal-array shutter.

In still another embodiment, the apparatus further comprises means for moving the field stop in the direction of the optical axis of the confocal optical system.

In still another embodiment, the determination means utilizes process information for forming the marks.

According to another aspect, the present invention which achieves the above-described object relates to a position detection apparatus for detecting a position of a flat object, comprising marks having projections and recesses formed on a surface of the object, detection means for detecting respective positional information of the marks within a plurality of predetermined surfaces parallel to the surface of the object having different surface positions in a direction perpendicular to the surface of the object, means for selecting desired positional information from the respective positional information, and means for determining the positions of the marks from the desired positional information.

In one embodiment, the detection means comprises a confocal optical system, which observes the images of the marks within the predetermined surface. A field stop of the confocal optical system and the predetermined surface are optically conjugate with each other. The apparatus further comprises means for moving the surface of the object in a direction perpendicular to the surface of the object.

In another embodiment, the apparatus further comprises a plurality of field stops of the confocal optical system corresponding to the plurality of predetermined surfaces. Each of the plurality of field stops and the corresponding one of the plurality of predermined surfaces are optically conjugate with each other. The field stop and the object perform relative movement in the direction of position detection of the marks.

In still another embodiment, the desired positional information is selected based on the contrast of the images of the marks.

A position detection method for detecting a position of a flat object comprises the steps of (1) forming marks having at least one of (i) projections and (ii) recesses on a surface of an object, (2) detecting the position of the surface of the object in a direction perpendicular to the surface of the object, (3) determining the position of a predetermined plane parallel to the surface of the object based on position of the surface of the object detected in the position detecting step, and (4) detecting the position of the marks within the predetermined plane.

According to yet another aspect of the present invention, the position detection method for detecting a position of a flat object includes the steps of (1) forming marks having at least one of (i) projections and (ii) recesses on a surface of the object, (2) detecting positional information of the marks relative to a plurality of predetermined planes parallel to the surface of the object and having different steps in a direction perpendicular to the surface of the object, (3) selecting a subset of positional information from the detected positional information, and (4) determining the position of the marks from the subset of positional information.

According to a further aspect of the present invention, an exposure apparatus for detecting the positions of marks formed on a wafer, and for projecting and exposing a pattern formed on a reticle onto the wafer includes a movable stage for mounting the wafer. Marks having at least one of (i) projections and (ii) recesses are formed on a surface of the wafer. First position detection means are provided for detecting the position of a surface of the wafer in a direction perpendicular to the surface of the wafer. Means are provided for determining the position of a predetermined plane parallel to the surface of the wafer based on the position of the surface of the wafer detected by the first position detection means. Second position detection means are provided for detecting the positions of the marks within the predetermined plane. A control system is provided for causing the movable stage to move the wafer to a predetermined position based on the positions of the marks detected by said second position detection means. The control system also projects and exposes the pattern formed on the reticle onto the thus-positioned wafer.

According to yet a further aspect of the present invention, an exposure apparatus for detecting the positions of marks formed on a wafer, and for projecting and exposing a pattern formed on a reticle onto the wafer includes a movable stage for mounting the wafer. Marks having at least one of (i) projections and (ii) recesses are formed on a surface of the wafer. Detection means are provided for detecting positional information of said marks relative to a plurality of predetermined planes parallel to the surface of the object and having different steps in a direction perpendicular to the surface of the object. Means are provided for selecting a subset of positional information from the detected positional information. Means are also provided for determining the positions of the marks from the subset of positional information. A control system is provided for causing said movable stage to move the wafer to a predetermined position based on the positions of the marks detected by said determining means. The control system also projects and exposes the pattern formed on the reticle onto the thus-positioned wafer.

According to another aspect of the present invention, a method for manufacturing semiconductor devices by detecting the positions of marks formed on a wafer, and by projecting and exposing a pattern formed on a reticle onto the wafer includes the step of forming marks having at least one of (i) projections and (ii) recesses on a surface of the wafer. The position of a surface of the wafer is detected in a direction perpendicular to the surface of the wafer. The position of a predetermined plane parallel to the surface of the wafer is determined based on the position of the surface of the wafer detected in the position detecting step. The positions of marks within the predetermined plane are then detected. The wafer is then moved to a predetermined position based on the positions of the marks detected in the second position detecting step. Then, the pattern formed on the reticle is projected and exposed onto the wafer.

According to a further aspect of the present invention, a method for manufacturing semiconductor devices by detecting the positions of marks formed on a wafer, and by projecting and exposing a pattern formed on a reticle onto the wafer includes the step of forming marks having at least one of (i) projections and (ii) recesses on a surface of the wafer. Positional information of the marks relative to a plurality of predetermined planes parallel to the surface of the wafer and having different steps is detected in a direction perpendicular to the surface of the wafer. A subset of positional information is selected from the detected positional information. The positions of the marks are determined from the subset of positional information. The wafer is then moved to a predetermined position based on the positions of the marks determined in said determining step. The pattern formed on the reticle is then projected and exposed onto the wafer.

The foregoing and other objects, advantages and features of the present invention will become more apparent from the following description of the preferred embodiments taken in conjuction with the accompanying drawings.

BRIEF DESCRIPTION OF THE DRAWINGS

FIGS. 1 through 4(A) are cross-sectional views, each illustrating a photoresist and a wafer mark;

FIGS. 18(A) through 18(E) are diagrams illustrating various kinds of marks for focus measurement;

DESCRIPTION OF THE PREFERRED EMBODIMENTS

Figure 5:
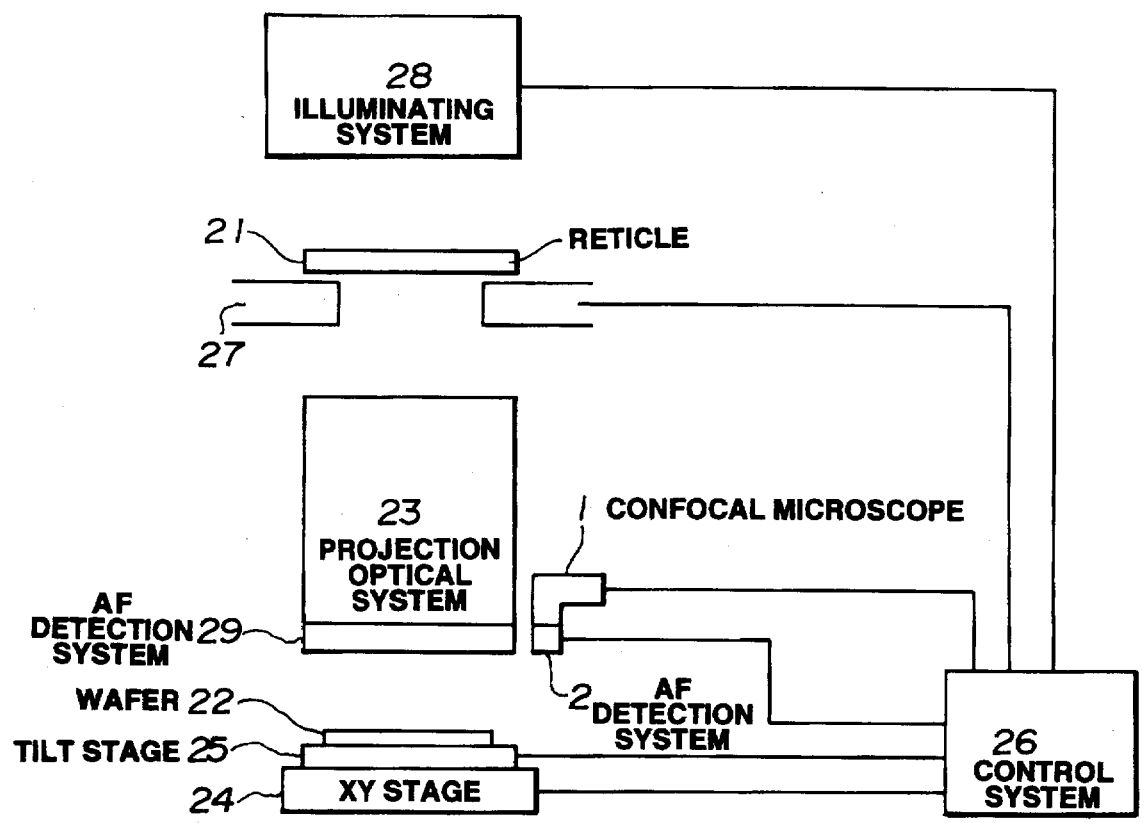
FIG. 5 is a diagram illustrating the schematic configuration of a principal portion of an apparatus according to a first embodiment of the present invention.

FIG. 5 is a diagram illustrating the schematic configuration of a principal portion of a projection exposure apparatus for manufacturing semiconductor devices according to a first embodiment of the present invention.

Figure 6:
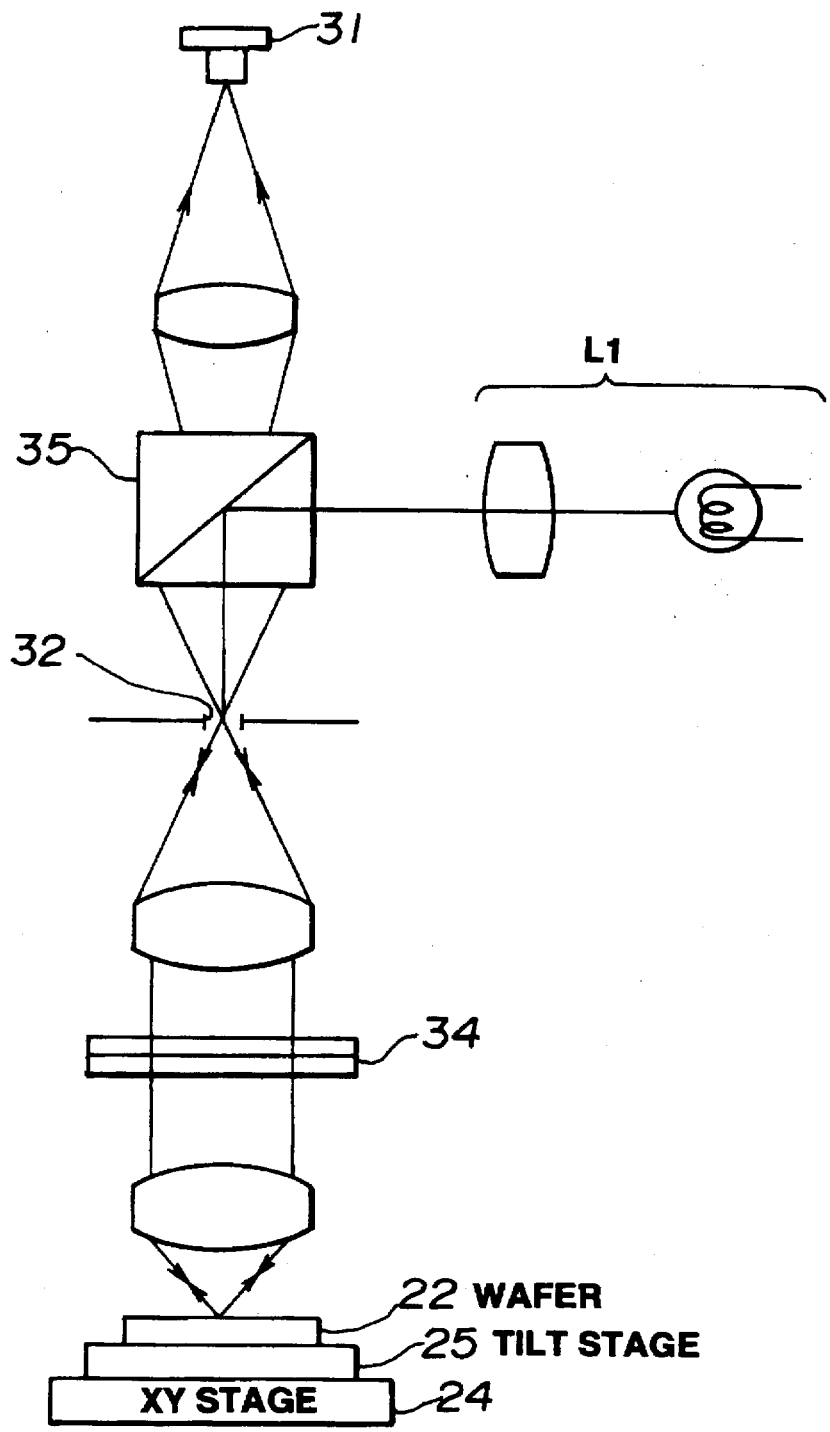
FIGS. 6 through 8 are diagrams illustrating the schematic configuration of a confocal microscope according to the present invention.

In FIG. 6, projection optical system 23 projects a pattern (not shown) on the surface of reticle 21, serving as a first object, illuminated by exposure light from illuminating system 28 onto the surface of wafer 22, serving as a second object. Wafer 22 is subjected to a known developing process to manufacture semiconductor devices.

A resist, which is transparent to a nonsensitive alignment wavelength and serves as a photosensitive member, is coated on wafer 22. Wafer 22 is fixed on tilt stage 25, which is disposed on XY stage 24 having an interferometer, and which is movable in the direction of tilt and the optical axis.

Tilt stage 25 is controlled by a driving source, such as a piezoelectric element or the like (not shown), in a submicrometer driving accuracy.

XY stage 24 and tilt stage 25 are monitored by respective laser length-measuring machines (not shown), and the amounts of movement of the respective stages are controlled.

Reference numeral 29 represents an AF (autofocus) detection system for wafer exposure.

Confocal microscope 1 is provided as a so-called non-TTL off-axis microscope independent of projection optical system 23. Focus detection system (AF detection system) 2 for detecting positional information relating to the resist surface is provided in confocal microscope 1. Focus detection system 2 detects positional information relating to the resist surface utilizing an air method, an optical oblique incidence method or the like.

As shown in FIG. 6, pinhole 32, serving as a field stop in a surface optically conjugate with detection surface 22, is provided in confocal microscope 1. Symbol L1 represents an illuminating system, 35 is a beam splitter, 34 is a wavelength plate, and 31 is a Si photodetector.

Figure 7:
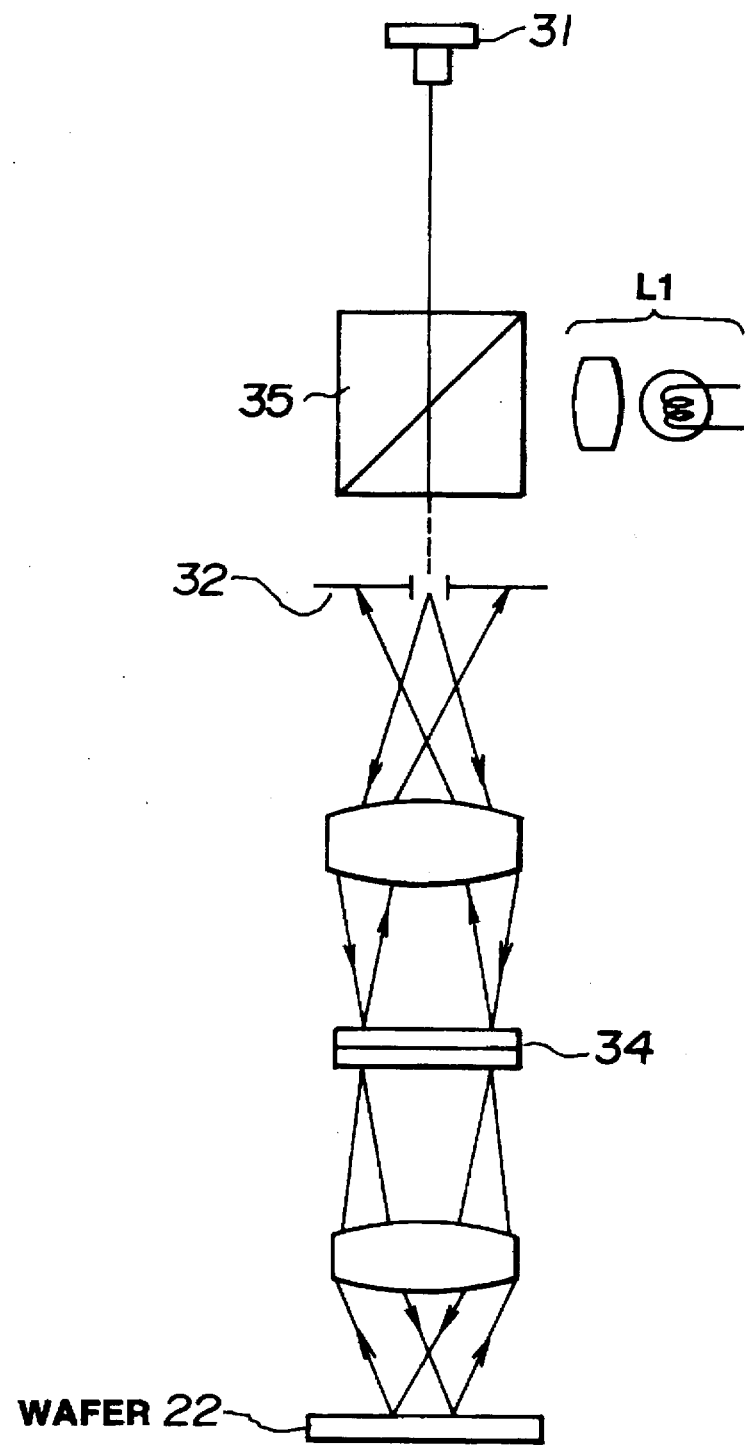

As shown in FIG. 7, when the surface of wafer 22, serving as the surface to be detected, is in a defocus state, the light beam spreads at the surface of pinhole 32, so that the amount of the light beam passing through pinhole 32 is reduced.

According to this optical principle, a detection optical system having a focal depth shallower than in the conventional optical system is obtained.

Figure 8:
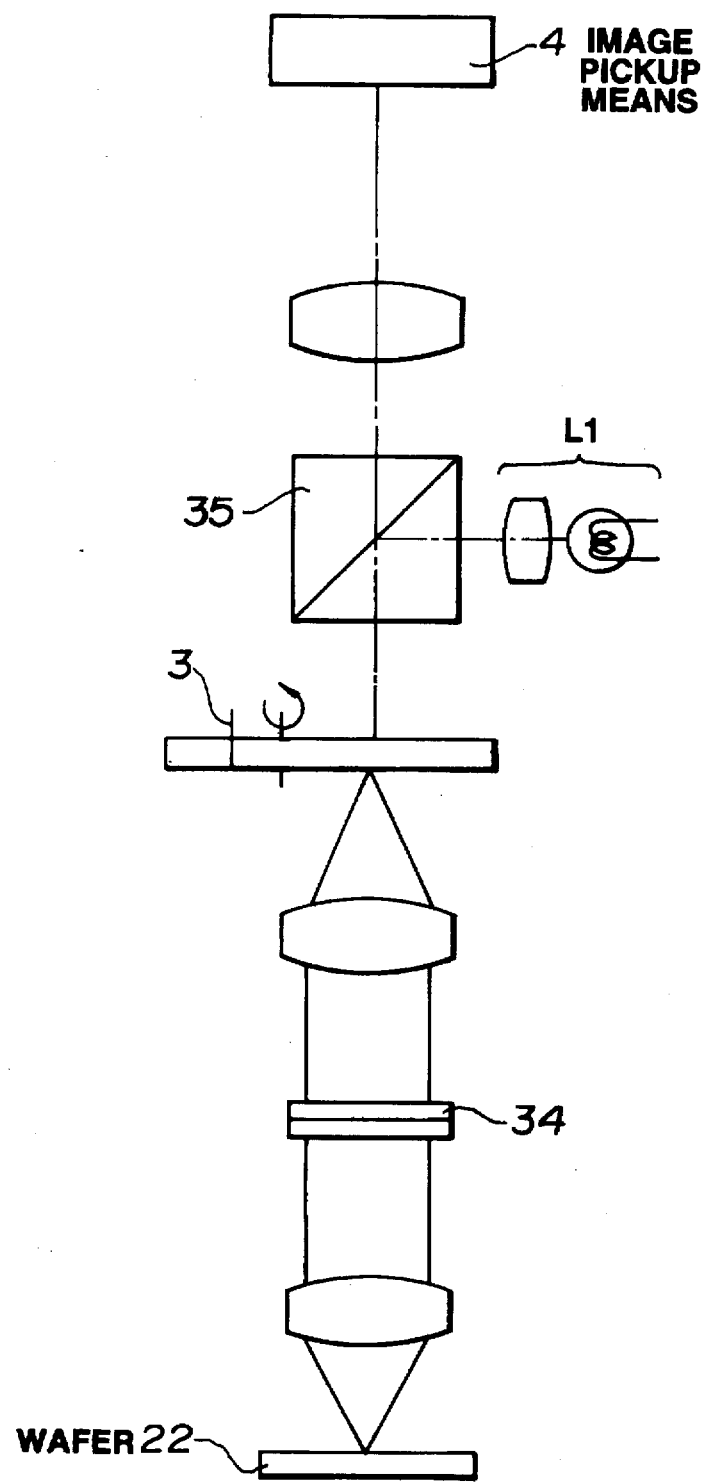
Figure 9:
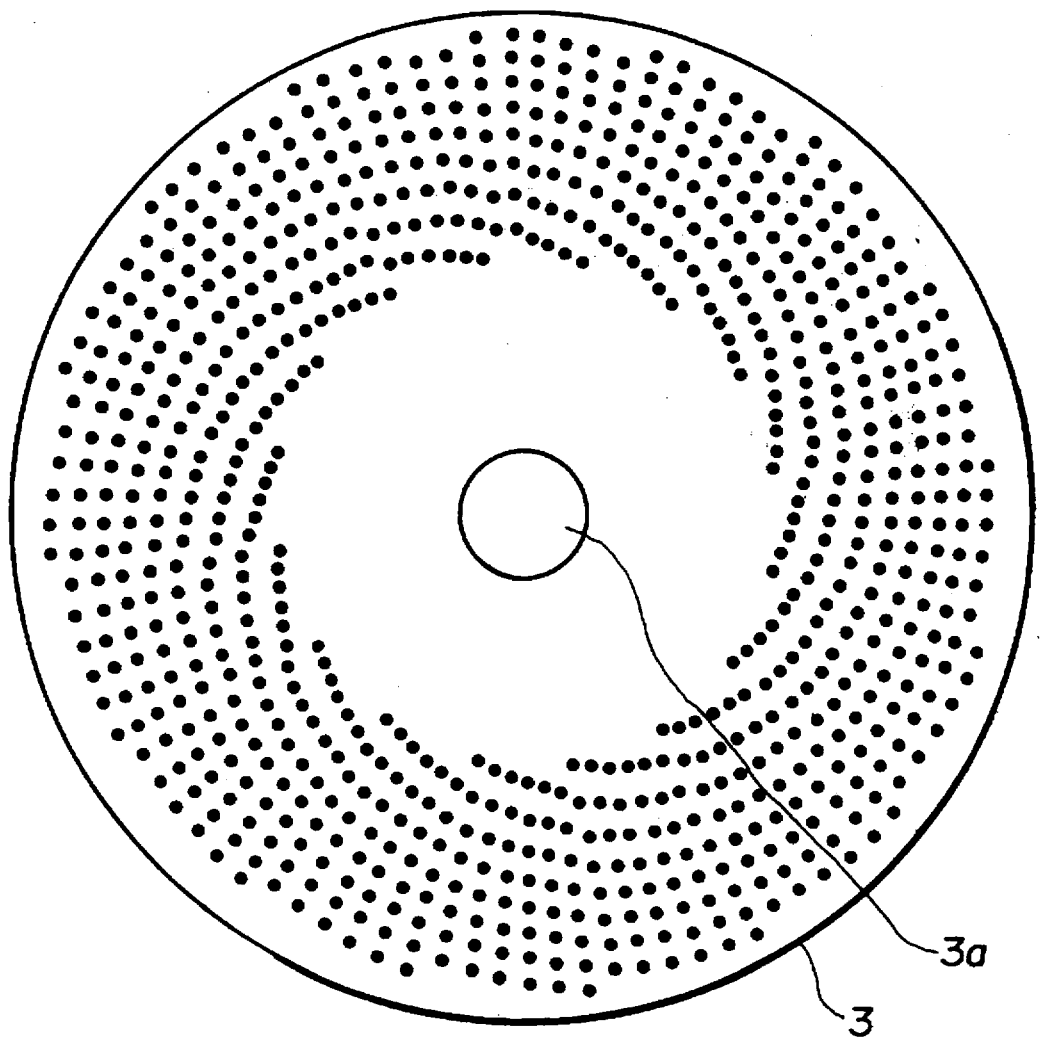
FIG. 9 is a diagram illustrating a Nipkow disk.

FIG. 8 is a diagram illustrating the schematic configuration of a principal portion of the confocal microscope when positional information relating to the surface of wafer 22 is detected two-dimensionally. In FIG. 8, reference numeral 3 represents a Nipkow disk. As shown in FIG. 9, Nipkow disk 3 is a disk in which a large number of pinholes are provided, and which rotates around shaft 3a.

Referring again to FIG. 5, control system 26 performs control by detecting positional information relating to the surface of wafer 22, the resist surface, and the like. Various kinds of information relating to the process have been input to control system 28 in advance.

Figure 1:
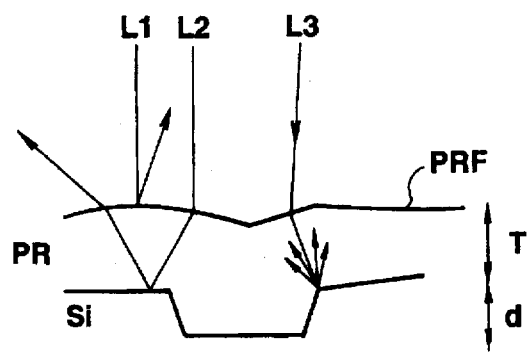

For example, referring to FIG. 1, the thickness T of photoresist PR formed on the wafer surface, the refractive index N of photoresist PR, the depth of step d of the alignment mark, surfaces to be adjusted with the alignment mark (for example, the wafer's top surface WT, or the wafer's bottom surface WB), and the like are input.

Next, a description will be provided of the process of detection of positional information relating to the wafer surface in the present embodiment.

Step 1. X-Y stage 24 is moved so that the alignment mark on the surface of wafer 22 to be detected is positioned under confocal microscope 1.

Step 2. Photoresist surface PRF is detected by AF detection system 2. The distance $Z_0$ from the surface of PRF to the focus plane of confocal microscope 1 in the z direction (the direction of the optical axis) is calculated from the value obtained in the PRF surface detection.

Step 3. Input mode. For example, when focusing confocal microscope 1 on the wafer's top surface WT, wafer 22 is driven in the z direction by Z0+T/N (N is the refractive index of the photoresist) by tilt stage 25.

Step 4. The position of the wafer's top surface WT is detected by confocal microscope 1.

When detecting the wafer's bottom surface WB, the amount of drive in the z direction in step 3 equals Zo+(T+d)/N.

Such values are known values. Hence, by providing in advance the distances T and d of the detection position down from the photoresist surface PRF linked with the wafer process job for forming the mark, the focus position when detecting an alignment signal is determined.

Conventionally, there have been only low-accuracy methods in which, for example, the contrast of the image is observed and the position having the greatest contrast is determined. According to the present embodiment, however, by setting in advance the focus position instead of determining the position by observing the contrast, a more rational and more precise signal is detected.

Alternatively, a signal to be detected may be determined by separately detecting information relating to an upper portion and a lower portion of the step of an alignment mark, obtaining the difference between the two kinds of information, and knowing which information is closer to the desired value (for example, the desired scaling value of the wafer before coating the resist measured by separate means) by analyzing previously known scaling and a change in the data caused by a uniformly coated component.

Figure 10:
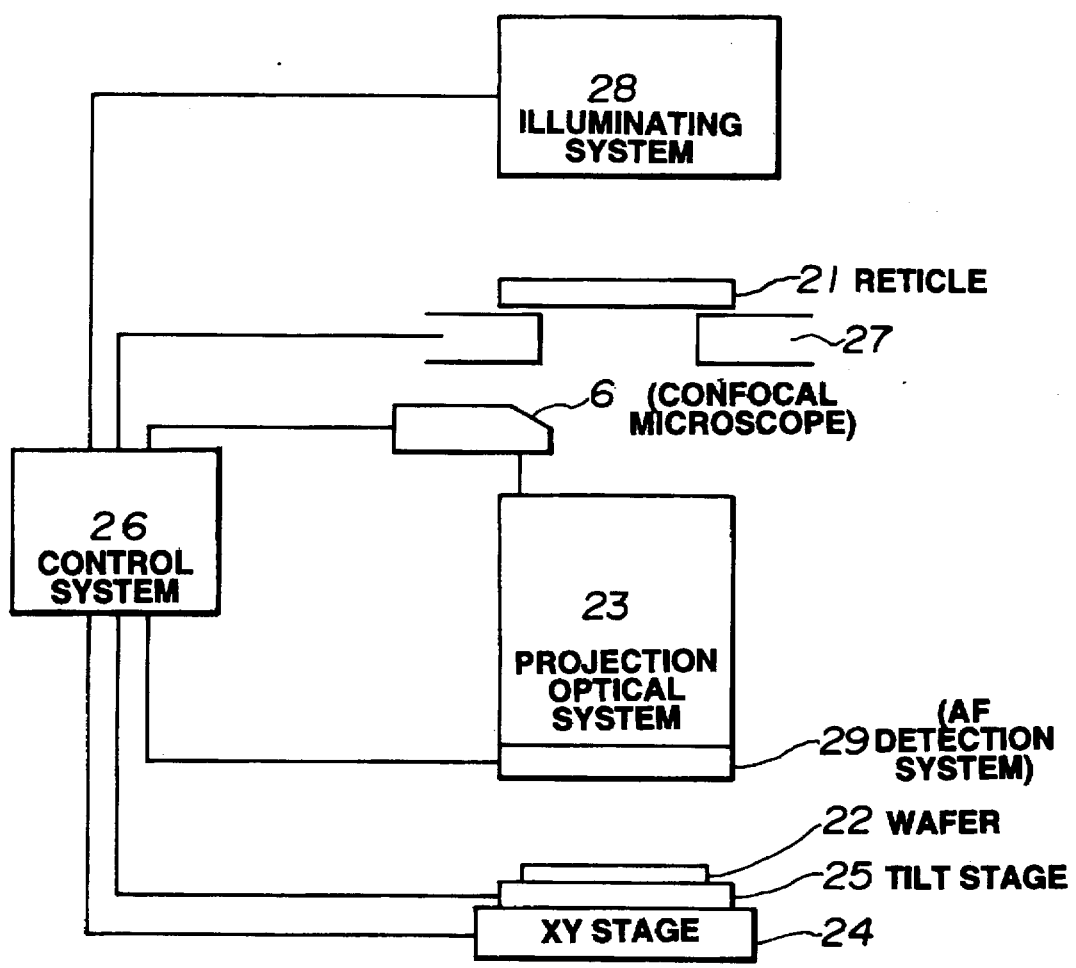
FIG. 10 is a diagram illustrating the schematic configuration of a principal portion of an apparatus according to a second embodiment of the present invention.

FIG. 10 is a diagram illustrating the schematic configuration of a principal portion of a projection exposure apparatus for manufacturing semiconductor devices according to a second embodiment of the present invention.

The present embodiment differs from the first embodiment shown in FIG. 5 in that confocal microscope 6 utilizes projection optical system 23, and is used as a TTL off-axis microscope for detecting positional information relating to the surface of wafer 22. Other components are substantially the same as those in the first embodiment.

The configuration of confocal microscope 6 is basically the same as that shown in FIG. 8.

AF detection system 29 used when exposing wafer 22 is also used for alignment.

In the present embodiment, when a pinhole is used instead of the Nipkow disk in order to achieve a confocal state, it is necessary to detect positional information by moving or scanning X-Y stage 24. At that time, the photoelectric transducer need not be image pickup means 4, such as a CCD camera or the like, shown in FIG. 8. For example, Si detector 31 shown in FIG. 6 may be used as the photoelectric transducer, which need not be disposed at the image surface.

Figure 11:
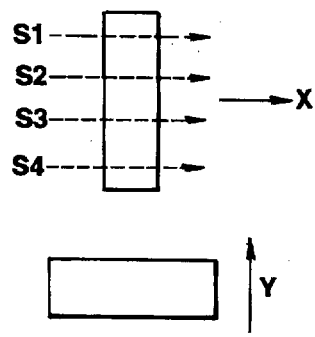
FIG. 11 is a diagram illustrating alignment marks used in the apparatus shown in FIG. 10.

FIG. 11 is a diagram illustrating the schematic configuration of alignment marks according to the present embodiment.

In the present embodiment, when detecting alignment marks disposed in the x and y directions, X-Y stage 24 detects positional information relating to the x direction by performing scanning in the x direction, and detects positional information relating to the y direction by performing scanning in the y direction. The focal depth is determined by the size of the pinhole for providing a confocal state. In general, a pinhole having a diameter as large as the critical resolving power of the imaging optical system is adopted. However, when the diameter of the pinhole is reduced, the following two problems arise.

(1-1) The amount of light is reduced.

(1-2) The detection time is increased.

In particular, a description will now be provided of an increase in the detection time of item (1-2) by paying attention to the x direction of the alignment mark shown in FIG. 11, in which the direction of position detection is the x direction.

If the diameter of the pinhole is assumed to be 0.5 μm when projected on the wafer, X-Y stage 24 is driven to perform scanning so that the pinhole is focused onto scanning line S1. In order to perform high-precision position detection, it is necessary to perform scanning of scanning lines S2–S4 as well as scanning line S1 in the x direction by moving X-Y stage 24 in the y direction. Accordingly, four scanning operations for scanning lines S1–S4 must be performed, causing an increase in the detection time.

In the present embodiment, the above-described problems (1-1) and (1-2) are solved by adopting a slit-like field stop, extended in a direction orthogonal to the direction of detection and adjusted to the alignment mark. The size of the shorter side of the slit is 0.5 μm, which equals the diameter of the pinhole, and the size of the longer side of the slit is determined in accordance with the length of the alignment mark. In order to remove the influence of the edge, the size of the longer side of the pinhole is made to be more or less shorter than the length of the alignment mark. More specifically, in the case of the alignment mark shown in FIG. 11, the size of the longer side of the slit equals the distance between scanning line S1 and scanning line S4. In order to remove the influence of the edge, the size of the longer side of the slit is preferably shorter than the length of the alignment mark by at least 5 µm.

Figure 12:
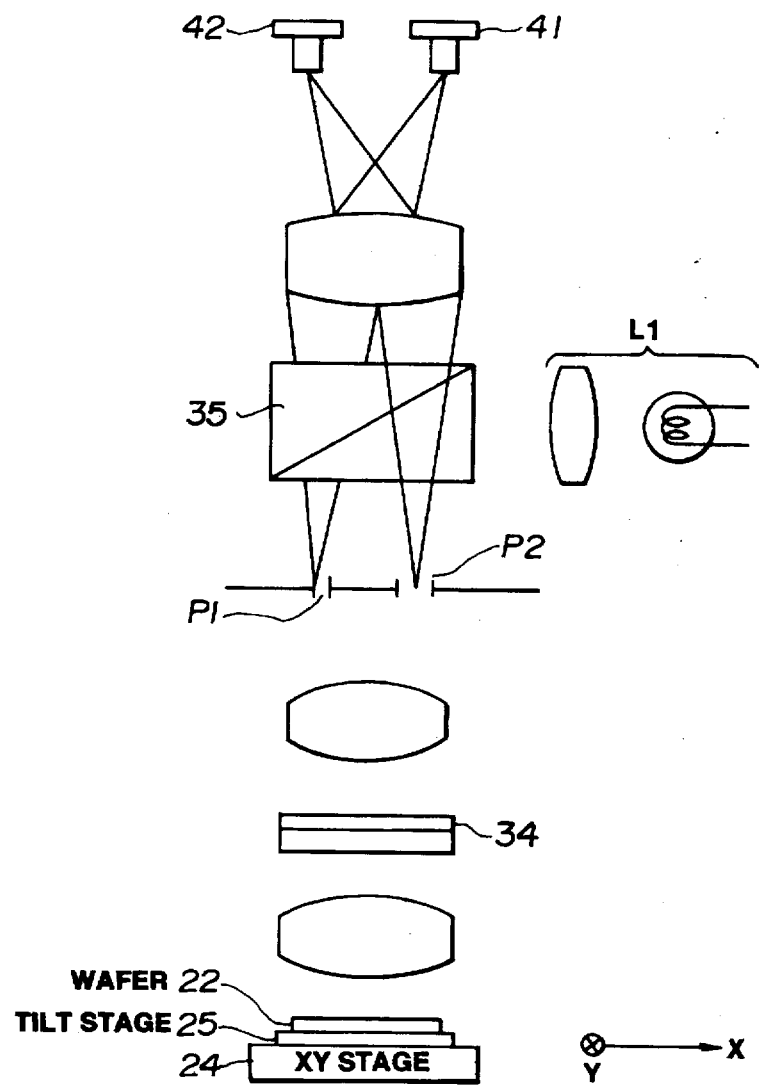
FIG. 12 is a diagram illustrating a confocal microscope according to the present invention.

FIG. 12 is a diagram illustrating the schematic configuration of a principal portion of a confocal microscope configured in accordance with the alignment marks shown in FIG. 11.

In FIG. 12, two slit-like field stops P1 and P2 are present, which are orthogonal to each other corresponding to the alignment marks in the x and y directions shown in FIG. 11. Si detectors 41 and 42 are disposed for slit-like field stops P1 and P2, respectively. First, X-Y stage 24 performs one scanning operation in the x direction, and position detection in the x direction is performed by Si detector 41.

Next, the positions of the alignment marks in the y direction are detected by Si detector 42 while moving X-Y stage in the y direction.

At that time, the y direction shown in FIG. 12 is perpendicular to the plane of FIG. 12. Focus setting at that time is performed in the same manner as in the first embodiment.

By vibrating slit-like field stops P1 and P2 shown in FIG. 12 in the x direction and the y direction, and using a CCD camera instead of Si detectors 41 and 42, it is possible to provide a confocal microscope which achieves the object of the present invention without performing scanning of X-Y stage 24.

Figure 13A:
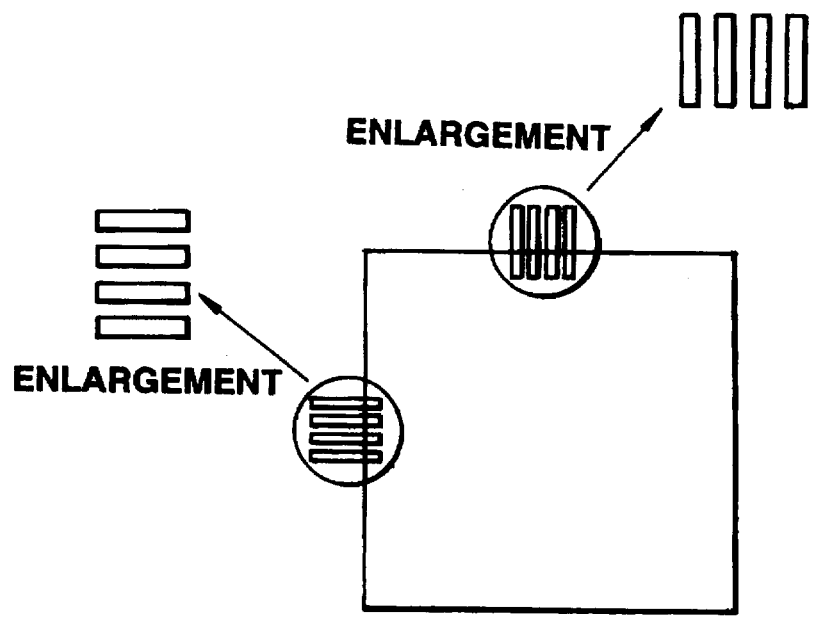
FIGS. 13(A) and 13(B) are diagrams illustrating a part of FIG. 12.
Figure 13B:
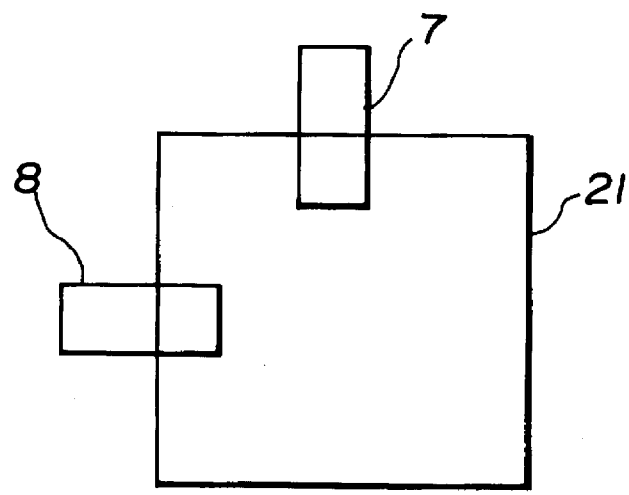

When detecting a chip and alignment marks as shown in FIG. 13(A), as shown in FIG. 13(B), it is also possible to provide microscope 7 for measurement of the x direction, and microscope 8 for measurement of the y direction.

At that time, each of microscopes 7 and 8 includes only one slit-like field stop having only one direction of vibration. Accordingly, microscopes 7 and 8 can be realized by disposing similar microscopes so as to be orthogonal to each other.

It is also possible to provide a confocal microscope by driving a transparent portion of a liquid-crystal-array shutter in a manner as if a slit is vibrating, instead of vibrating a slit.

Figure 14A:
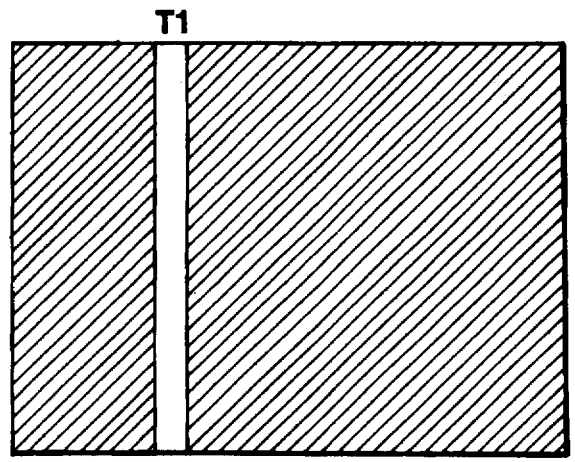
FIGS. 14(A) through 14(C) are diagrams illustrating states on the surface of an image pickup device when a liquid-crystal-array shutter is used.
Figure 14B:
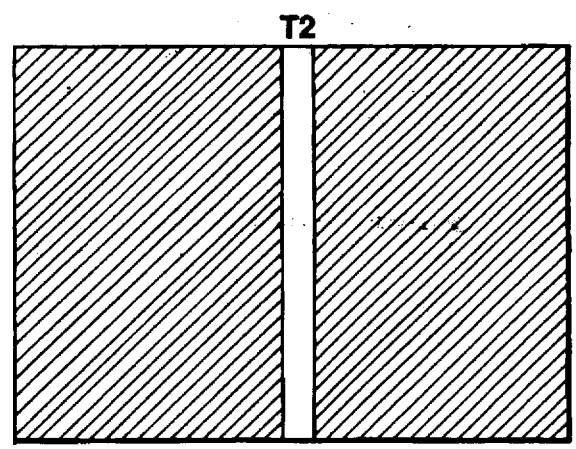
Figure 14C:
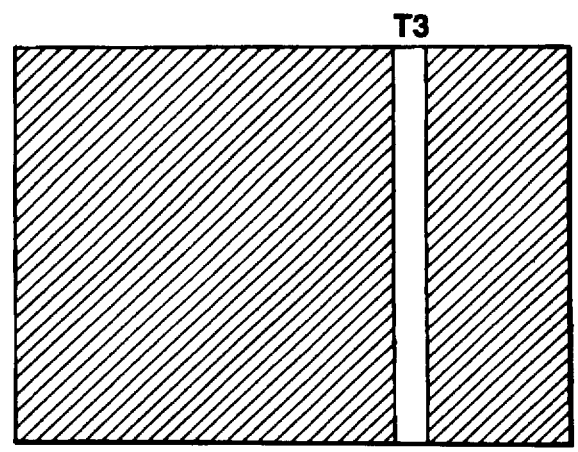

FIGS. 14(A) through 14(C) illustrate an example of driving of a liquid-crystal-array shutter. In the State of FIG. 14(A), transparent portion T1 is present at the left. With the lapse of time, the transparent portion moves to the position indicated by T2 shown in FIG. 14(B), and is further driven to the right to the position indicated by T3 in FIG. 14(C). The transparent portion is driven several times during the storage time of the CCD camera. By using the liquid-crystal-array shutter, scanning is performed at a high speed, and a detection optical system having no vibrating unit can be provided. Hence, the stability of the system is improved.

Next, a description will be provided of a method of determining focus offsets of AF detection systems 2 and 29 for alignment in the first and second embodiments, respectively.

Figure 15:
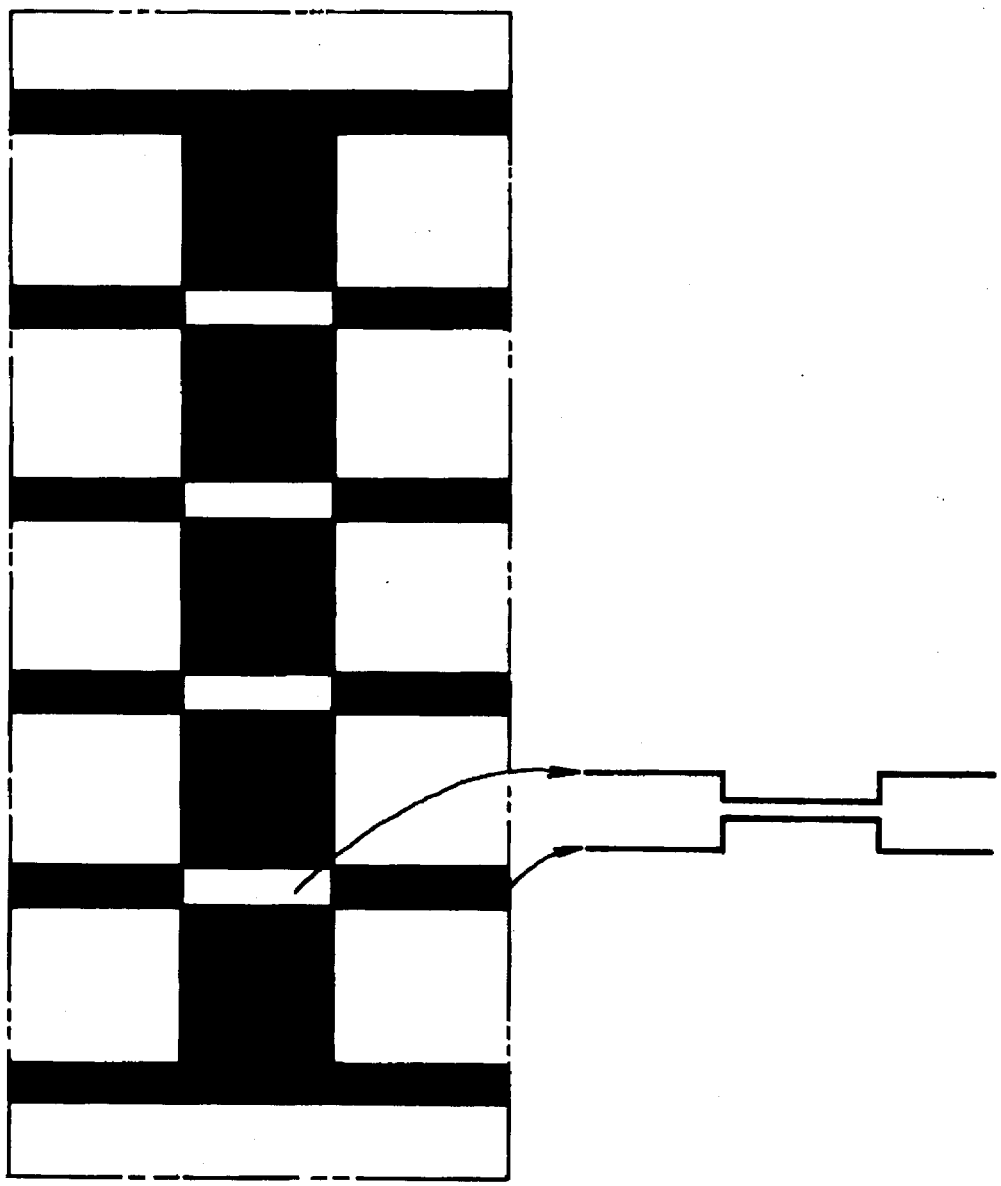
FIGS. 15 through 17 are diagrams illustrating marks for focus measurement.

FIG. 15 illustrates a mark for focus measurement. The mark is formed on a reticle. In FIG. 15, black portions indicate portions coated with Cr, and white portions indicate transparent portions not coated with Cr. If a reticle pattern is transferred onto a wafer and the transferred pattern is developed using a positive resist, the resist remains only in Cr portions. If such a wafer is etched, only the thickness of the portions not having Cr (the white portions shown in FIG. 15) is reduced.

Figure 16:
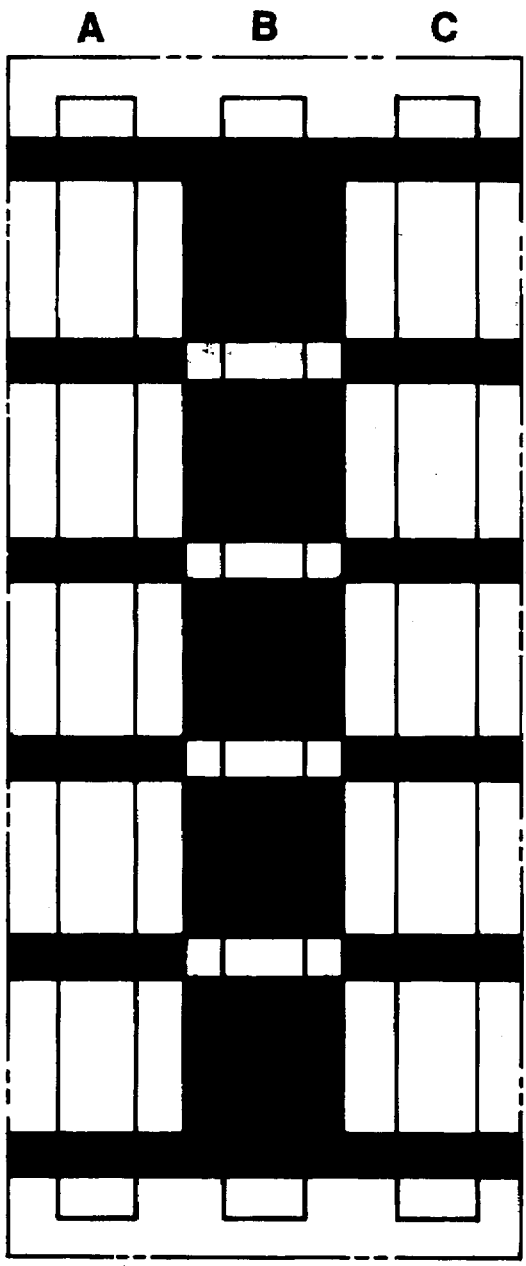

The position measurement of each mark within three windows A, B and C shown in FIG. 16 and pattern matching or the like is executed by the above-described confocal microscope. If the positions of each mark in the respective windows are represented by $TOC_A$, $TOC_B$ and $TOC_C$, and value $\Delta$ is expressed by $$(TOC_A + TOC_C)/2 - TOC_B = \Delta \tag{1}$$

where the value $\Delta$ is measured by changing the focus of the wafer, and a focus value satisfying the condition of $\Delta=0$ is originally satisfied is determined as a focus offset.

Figure 17:
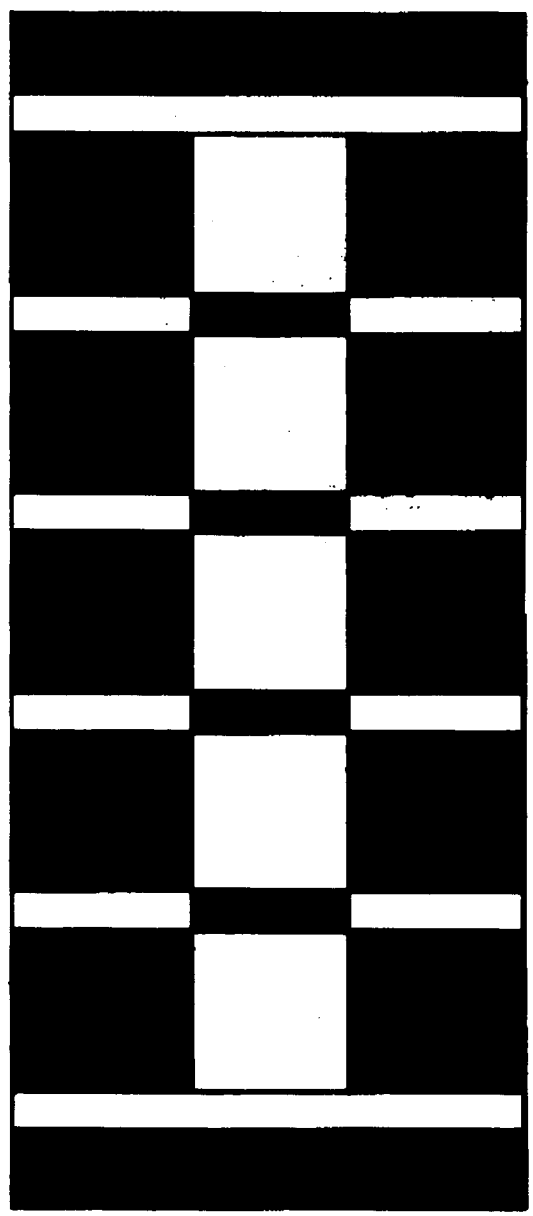

If a predetermined focus offset is present in the measuring system, the value $\Delta$ representing the change in the focus is measured also for the mark shown in FIG. 17, in which the black-and-white relationship is reversed from that shown in FIG. 15. The value of the focus where the valued $\Delta$ coincides with the value obtained from the mark shown in FIG. 15 becomes a focus offset.

If distortion produced in the process is as shown in FIGS. 18(A) through 18(C), the value $\Delta$ does not change with the defocus.

Suppose that the concave mark shown in FIG. 18(B) is distored to the right by $\epsilon$ from the design value (having a line width of $W_0$), and the convex mark shown in FIG. 18(C) is distorted to the left by $\epsilon$. If measurement is performed at that time, the two marks are measured by being shifted to the right by $\epsilon/2$, and no change is observed in the value $\Delta$. In such a case, the line width W is measured, and the amount of defocus where the measured value coincides with the predetermined line width $W_0$ may be set as a defocus offset.

FIG. 18(D) is a graph illustrating a relationship between the measured amount of defocus and the line width W. In the case of a concave mark, the line width W is shortened as the defocus moves above. In the case of a convex mark, the line width W is lengthened. In this case, the defocus ammount where $W=W_0$ for both convex and concave marks becomes an offset (the bottom in the case of FIGS. 18(A) through 18(C)).

When the process is complicated and the line width $W_0$ cannot be determined, the mark at the central spot of the wafer can be made to be a predetermined value, as shown in FIG. 18(E). In such a case, the line width $W_0$, of course, differs for a convex mark and a concave mark, and offset processing may be performed.

As described above, in the first and second embodiments, by detecting a surface shifted from the photoresist surface by a predetermined amount using a confocal microscope, it is possible to perform positioning with a desired process.

Figure 2:
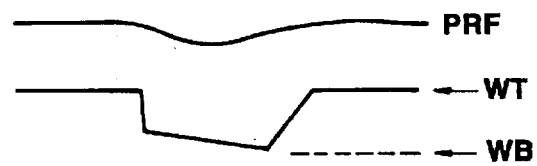
Figure 3:
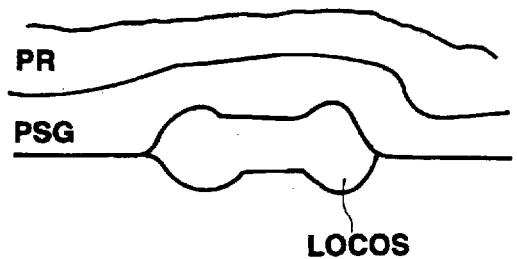
Figure 4A:
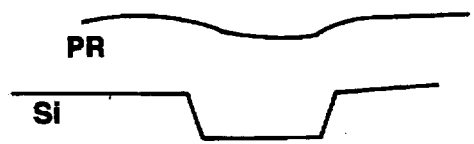
Figure 4B:
FIG. 4(B) is a diagram illustrating the waveform of a video signal.

In the case of objects to be measured as shown in FIGS. 2 and 3, the thicknesses and the refractive indices of photoresist PR, the PSG layer and the LOCOS mark, and the surface to be focused are input.

It is thereby possible to perform position detection in which a decrease in accuracy in positioning caused by an error in the process is prevented.

In the present invention, the above-described effects may also be obtained by vibrating a grating-like object (hereinafter termed a "grating"), in which many slit-like field stops are arranged, in the direction of measurment instead of using confocal slit-like field stops.

Figure 19:
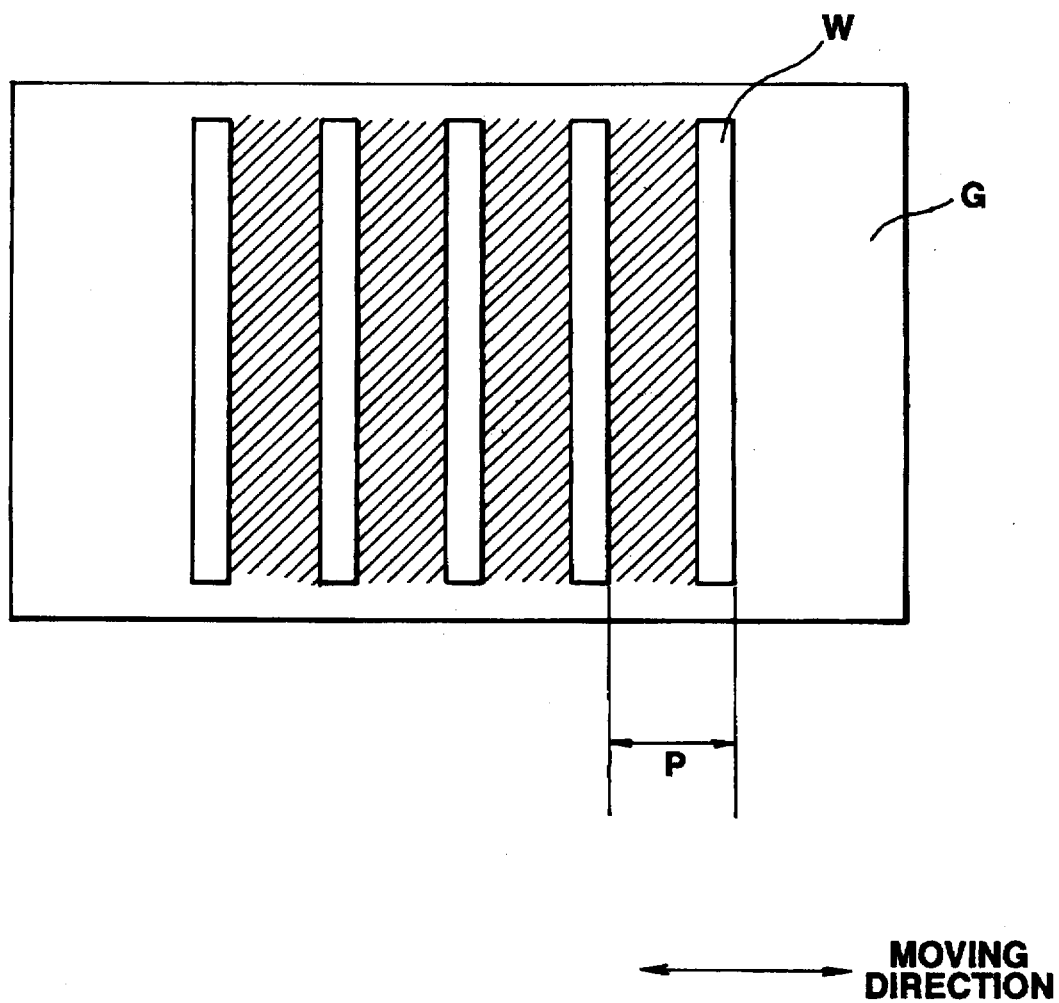
FIG. 19 is a diagram illustrating a grating according to the present invention.

FIG. 19 is a diagram illustrating the schematic configuration of grating G.

The shape of (transparent) aperture W of grating G is the same as that of the above-described slit-like field stop. If the pitch of the aperture has a small value, light from the adjacent aperture is mixed to become noise light having a DC component. For example, if it is assumed that the width of the aperture is 0.5 µm, and the pitch is 0.6 µm (the two values represent sizes on the wafer), the size of the opaque portion between openings W is 0.1 µm. Hence, if light passing through an aperture is reflected while the wafer is defocused, the reflected light enters the adjacent aperture.

In order to overcome such a problem, the width of the opaque portion must be increased so that the ratio (duty) of the opaque portion to the transparent portion is at least 1:1.

Suppose that the width of the aperture is fixed to 0.5 µm. In such a case, an increase in the ratio of the opaque portion results in an increase in the pitch. When light is sensed by a CCD camera or the like, an increase in the pitch will cause a decrease in accuracy in measurement due to a decrease in accuracy in the posture for vibrating the grating.

Figure 20:
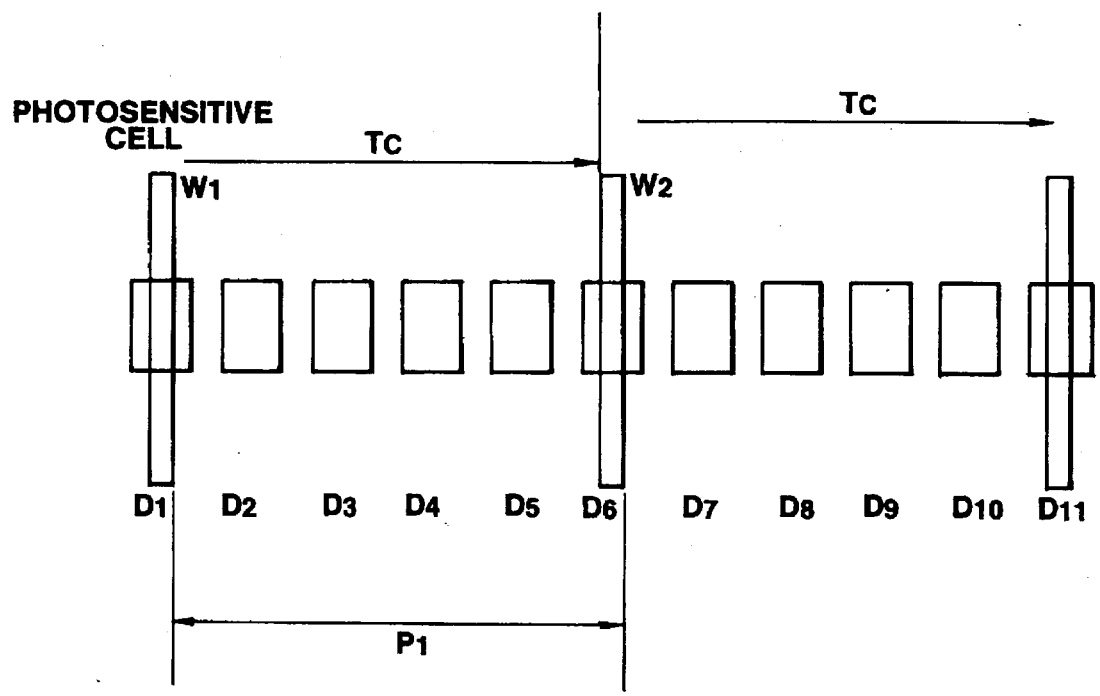
FIG. 20 is a diagram illustrating an image pickup device of a CCD camera according to the present invention.

A case, in which the slit aperture is superposed on one photocell of the CCD camera only once during the storage time, will be described with reference to FIG. 20. Suppose that an aperture $W_1$ moves from photocell D1 to photocell D5 during the storage time of the CCD camera.

At that time, if the pitch P of the aperture is assumed to equal the interval covering five photocells, another aperture $W_2$ moves from photocell D6 to photocell D11.

If unevenness is present in the speed of the movement, the amount of sensed light is inversely proportional to the speed, causing a distortion in the waveform of the signal obtained after photoelectric conversion, and a decrease in accuracy in alignment.

In order to overcome the above-described problem, the system is arranged such that a plurality of apertures pass through one photocell, so that a decrease in accuracy in measurement due to uneven scanning caused by a decrease in accuracy in the posture of aperture W is prevented by an averaging effect when the unevenness randomly occurs.

The effects of such an approach will be more specifically described using a numerical example.

The following values are values converted for the wafer surface unless particularly noticed.

The pitch between adjacent photocells of the CCD camera $P_c$: 0.2 µm

The storage time of the CCD camera $T_c$: 30 msec

The pitch of the grating $P_g$: 2 µm

The width of the aperture of the grating $W_a$: 0.5 µm

The speed of the movement of the grating V: 0.5 mm/sec

The time $T_p$ required for processing and the like after photoelectric conversion is first assumed to be "0 sec".

The number N of times the aperture of the grating passes over one photocell within the storage time is:

$$N = V \times T_c / P_c = 500 \times 0.03/2 = 7.5 \text{ (times)}.$$

The amount of light sensed by the CCD camera is proportional to this number N.

In order to reduce unevenness in speed by an averaging effect, the number N is preferred to be as large as possible. In order to increase the number N, it is necessary to increase the value of speed V and the value of storage time $T_c$, or to reduce the value of pitch $P_g$. The amount of light is also proportional to the duty D and the width $W_a$ of the aperture of grating G.

In the above-described case, $D = W_a/P_g = 4$.

Next, a description will be provided of a confocal detection method in which an autofocusing function is also provided.

This is achieved by moving a confocal pinhole (pinhole plate) also in the direction of the optical axis.

Figure 21:
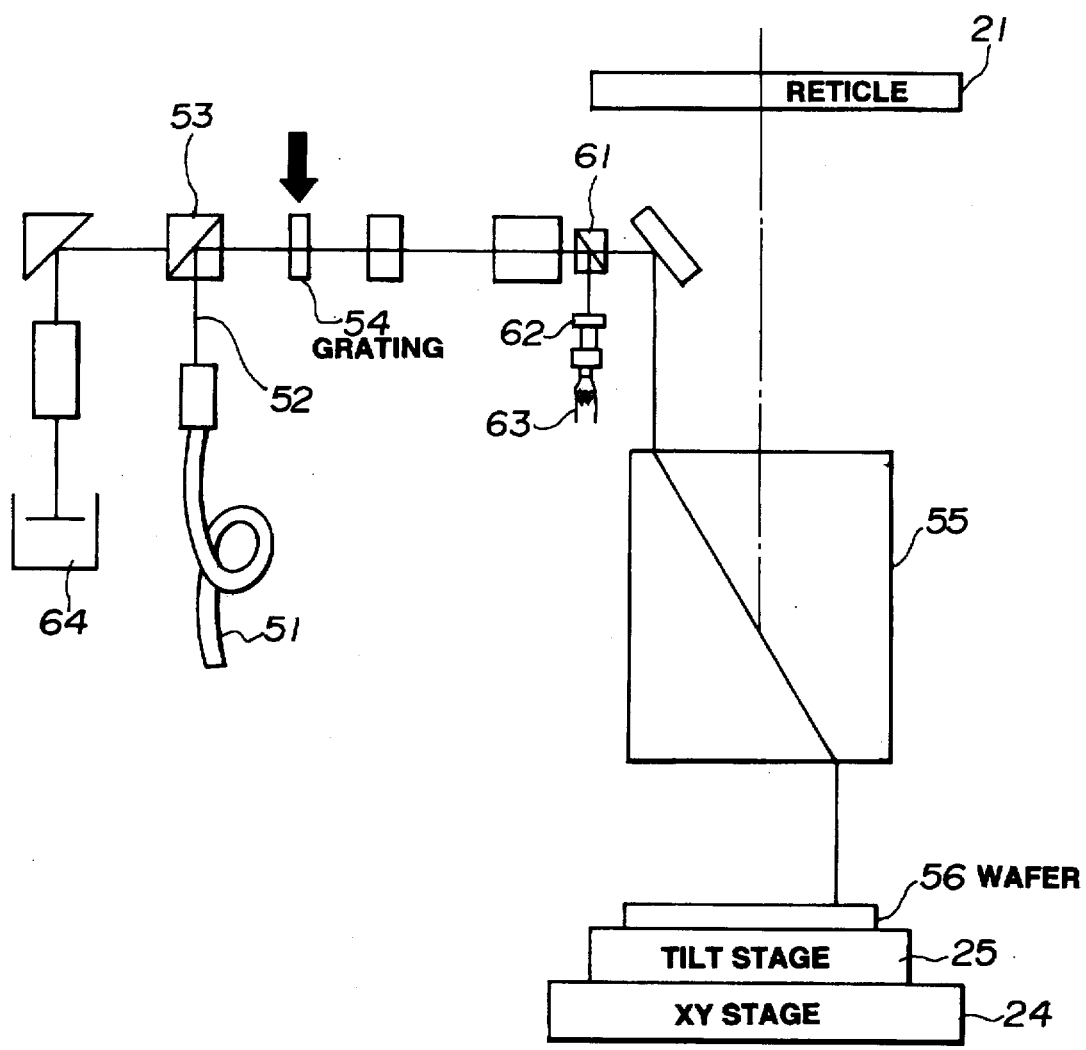
FIG. 21 is a diagram illustrating the schematic configuration of a principal portion of an apparatus according to a third embodiment of the present invention.

FIG. 21 is a diagram illustrating the schematic configuration of a principal portion of an apparatus according to a third embodiment of the present invention. FIG. 21 illustrates a case in which the present invention is applied to a grating-moving-type apparatus.

In FIG. 21, wafer 56 is detected through projection optical system 55. Only the S-polarized light of illuminating light 52 emitted from fibers 51 is reflected by polarizing beam splitter 53, and passes through grating 54. The light further passes through projection optical system 55, and illuminates alignment marks on wafer 58. The light reflected by wafer 86 again passes through projection optical system 55 and grating 54, so that "confocal" detection can be performed.

Figure 22:
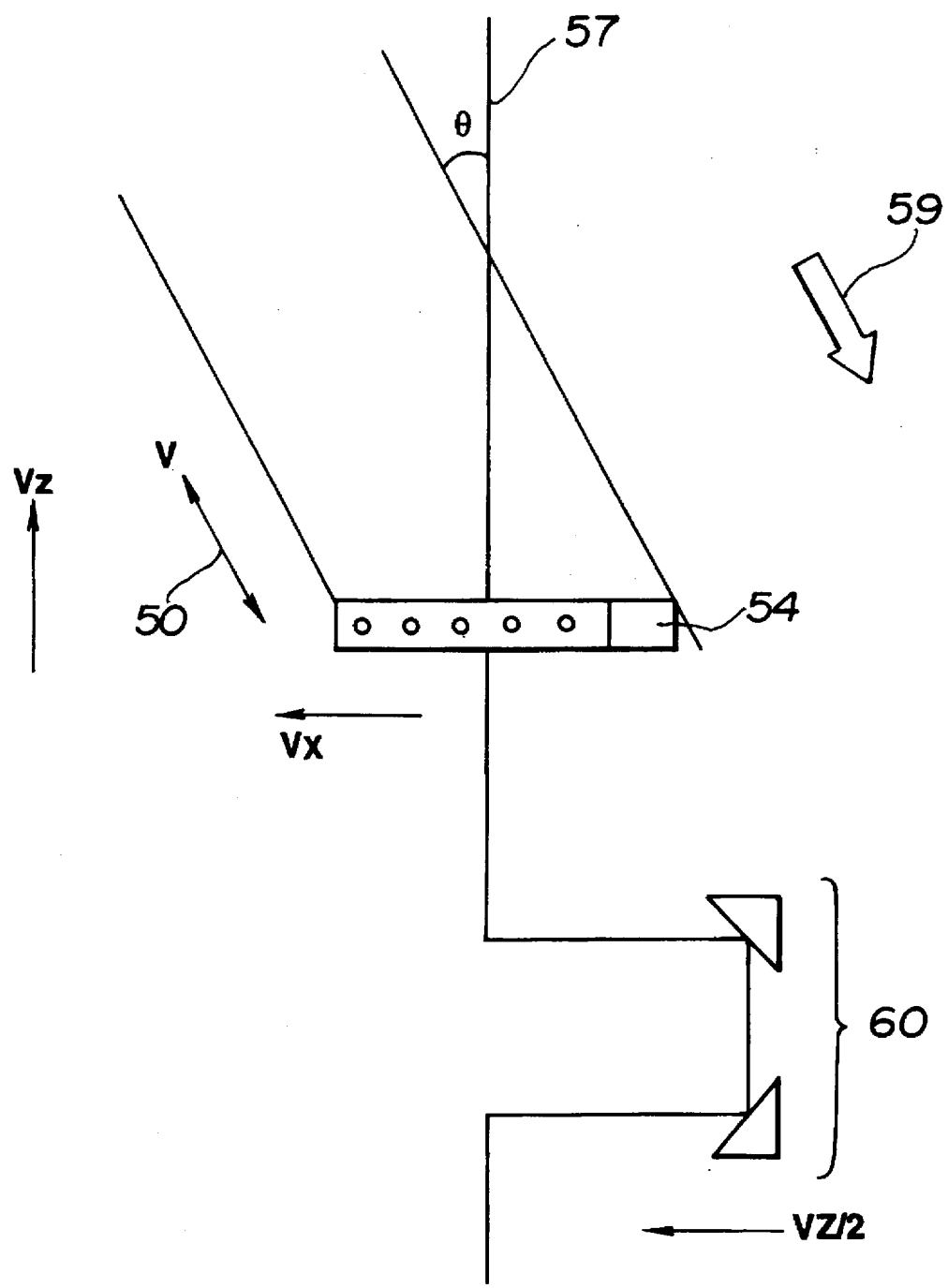
FIG. 22 is a diagram illustrating a part of FIG. 21.

FIG. 22 is a diagram illustrating a part of the apparatus, as viewed from the arrow shown in FIG. 21. Grating 54 is obliquely moved relative to optical axis 57 in the direction of the arrow 60 shown in FIG. 22.

As in the above-described embodiments, a "confocal" state is provided in the measuring direction. The image of wafer 56 is sensed while moving grating 54 in the direction of the optical axis, and the total amount of received light has a maximum value at a position where the position of grating 54 is optically conjugate with wafer 66. Thus, an autofocusing function is provided.

As shown in FIG. 22, when grating 64 is moved making an angle θ with the optical axis at speed V, the speed $V_z$ in the direction of the optical axis and the speed $V_x$ in the direction of measuring the position of the wafer are expressed as follows:

$$V_z = V\cos\theta \quad (2)$$

$$V_x = V\sin\theta \quad (3)$$

When the image is sensed by CCD camera 64 through the projection optical system 58, if a change in the direction of the optical axis during storage time Tc is within the optical depth of field, and if the value of the optical depth of field DOF is assumed to be 0.2 µm, the following value is obtained from the relationship $DOF \geq V_z \times T_c$:

$$2.0^2/0.03 = 6.67 \geq V_z(\mu m/sec).$$

The values have been calculated as values on wafer 56. Values on grating 54 will now be calculated.

If it is assumed that grating 54 is placed at a position having an optical magnification of 20 separated from wafer 56 whose position is to be detected, the speed $V_z$ has the following relationship:

$$0.2 \times 20^2/0.03 = 2.67 \geq V_z(mm/sec).$$

If $V_z = 2.67$, and V=10 mm/sec, the following value is obtained from $V_z = V \cos\theta$:

$$\theta = \cos^{-1}(2.67/10) = 74.5(deg).$$

From $V_x = V \sin\theta$, $$V_x = 10 \times \sin(74.5) = 9.64(mm/sec).$$

The amount of change $S_c$ of the direction of measurement during storage time $T_c$ is:

$$S_c = T_c \times V_x = 0.03 \times 9.64 = 0.289(mm).$$

The value on wafer 56 is obtained by dividing this value by the optical magnification 20 to be 14.5 (µm).

If the pitch of grating 54 is assumed to be 1 µm, the number N of the passage of the aperture of grating 54 over one photocell of CCD camera 114 during the storage time equals 14.5.

Since grating 54 moves in the direction of the optical axis at a speed of $V_z$ (=V cos θ), detection or position measurement for an autofocusing operation can be performed with an interval of $Z=V_z \times T_R$, where $T_R=T_c+T_p$ is the shortest time $T_R$ for performing continuous measurement.

If $T_R$=50 msec ($T_p$=20 msec), $Z=2.67\times0.05/20^2=0.33$ μm.

In this numerical example, measurement can be performed with a pitch of 0.33 μm.

When performing an autofocusing operation, the speed of movement of grating 54 need not be uniform. Accordingly, the following sequence may be considered. That is, the focus is measured in a state in which grating 54 is moved not uniformly in the direction of block arrow 59. After the focus is known, focusing is performed while moving wafer 56 by the amount of the focus, and the position of wafer 58 is detected by uniformly moving grating 54 in the direction inverse to block arrow 59.

Focusing and position detection can, of course, be performed in a single movement operation if measurement can be simultaneously performed.

As described above, it is possible to perform a confocal detection method in which an autofocusing function is also provided.

When grating 54 is moved in the direction of the optical axis, the imaging relationship between grating 54 and CCD camera 64 is shifted. Hence, even if an autofocusing operation can be performed, the image contrast is reduced because of defocus.

In order to overcome such a problem, the following countermeasures can be taken.

(2-1) The optical system after grating 54 is also moved by the same amount as grating 54.

(2-2) The length of the optical path is inversely corrected by the amount of movement of grating 54.

Inferior accuracy in the posture of the grating 54 in this correction may cause a decrease in accuracy in detection.

By disposing a reference mark between grating 54 and wafer 56, and simultaneously detecting the reference mark during correction, it is possible to prevent a decrease in accuracy in detection even if accuracy in the grating posture is inferior.

If accuracy in the grating posture is inferior, but reproducibility is present, the amount of deviation may be obtained before detecting the wafer, and processed as an offset.

FIG. 22 illustrates the schematic configuration of the apparatus which uses correction system 60 for inversely correcting the length of the optical path. In FIG. 22, the correction system 60 for the length of the optical path may move at a speed $V_z/2$ so that the optical path is constant when grating 54 moves at speed $V_z$.

FIG. 21 illustrates an example, in which reference mark-bearing reticle 62 is disposed, and illuminated by illuminating system 63.

Reference mark-bearing reticle 62 is illuminated by illuminating system 63, such as an LED (light-emitting diode) or the like, emitting light having a wavelength different from that of alignment light 52. The light passing through reference mark 62 is reflected by dichroic mirror 61, and is sensed by CCD camera FIG. 23 is an enlarged view of grating 54.

Figure 23:
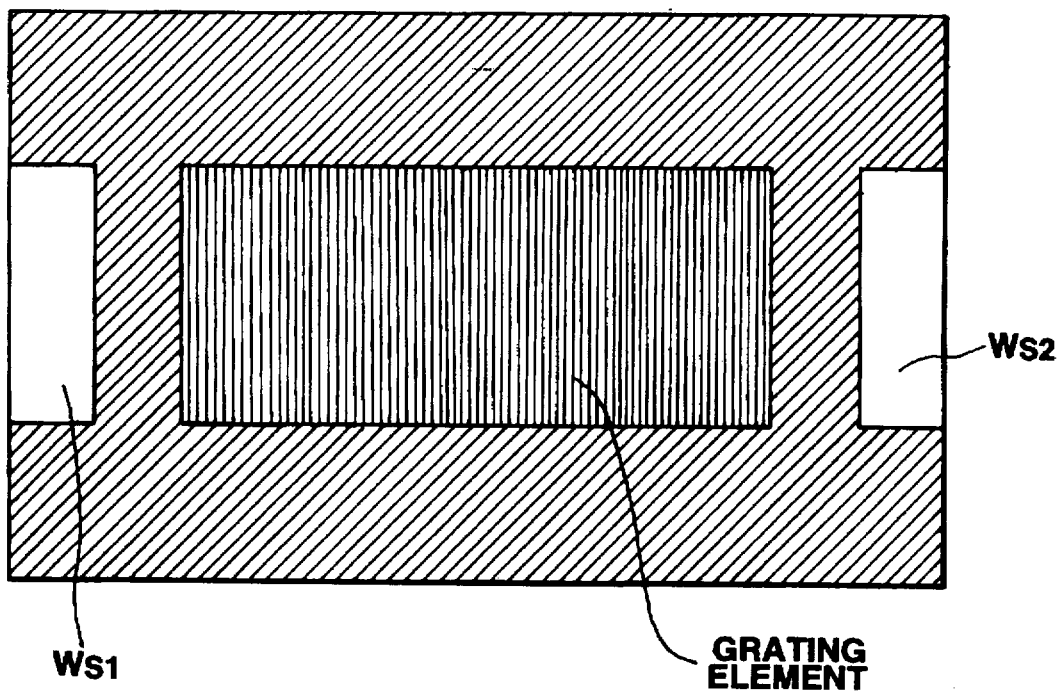
FIG. 23 is a diagram illustrating another part of FIG. 21.

In FIG. 23, the central portion has the shape of a grating, and transparent windows $W_{s1}$ and $W_{s2}$ for the reference mark are provided in the vicinity of the grating. The width of each of windows $W_{s1}$ and $W_{s2}$ is determined so that reference mark 62 can be sensed by CCD camera 64 even if grating 54 moves in the lateral direction.

In the present embodiment, positional information relating to the surface of wafer 56 is detected utilizing movable grating 54, CCD camera 64 and the like.

Figure 24:
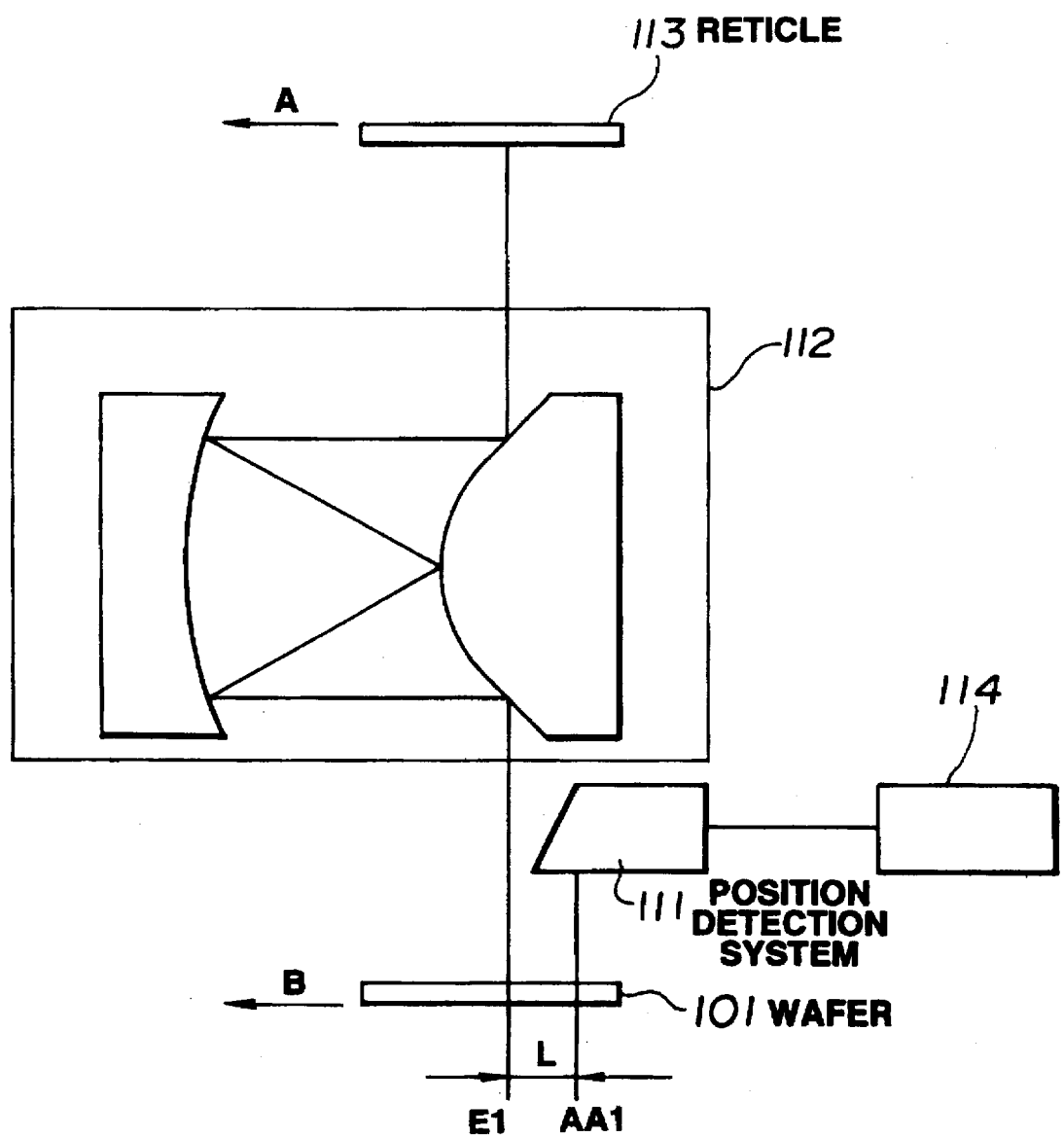
FIG. 24 is a diagram illustrating the schematic configuration of a principal portion of an apparatus according to a fourth embodiment of the present invention.

FIG. 24 is a diagram illustrating the schematic configuration of a principal portion of a projection exposure apparatus for manufacturing semiconductor devices according to a fourth embodiment of the present invention.

In FIG. 24, mirror projection optical system 112 projects and exposes a pattern on the surface of reticle 113 illuminated by exposure light from an illuminating system (not shown) onto the surface of wafer 101 while reticle 113, serving as a first object, and wafer 101, serving as a second object, are moved in the direction of the arrows A and B, respectively.

At that time, position detection system 111 for detecting the position of the wafer is disposed in a so-called non-TTL off-axis state not utilizing mirror projection optical system 112, and separated by a distance L from exposure position E1. Accordingly, when performing exposure, the wafer first moves under position detection system 111, and is then exposed. By adopting such an arrangement, die-by-die alignment can be performed. Furthermore, by having a processing system in which alignment is completed before exposure, a high throughput can be obtained.

Position detection system 111 includes a confocal optical system.

Figure 25:
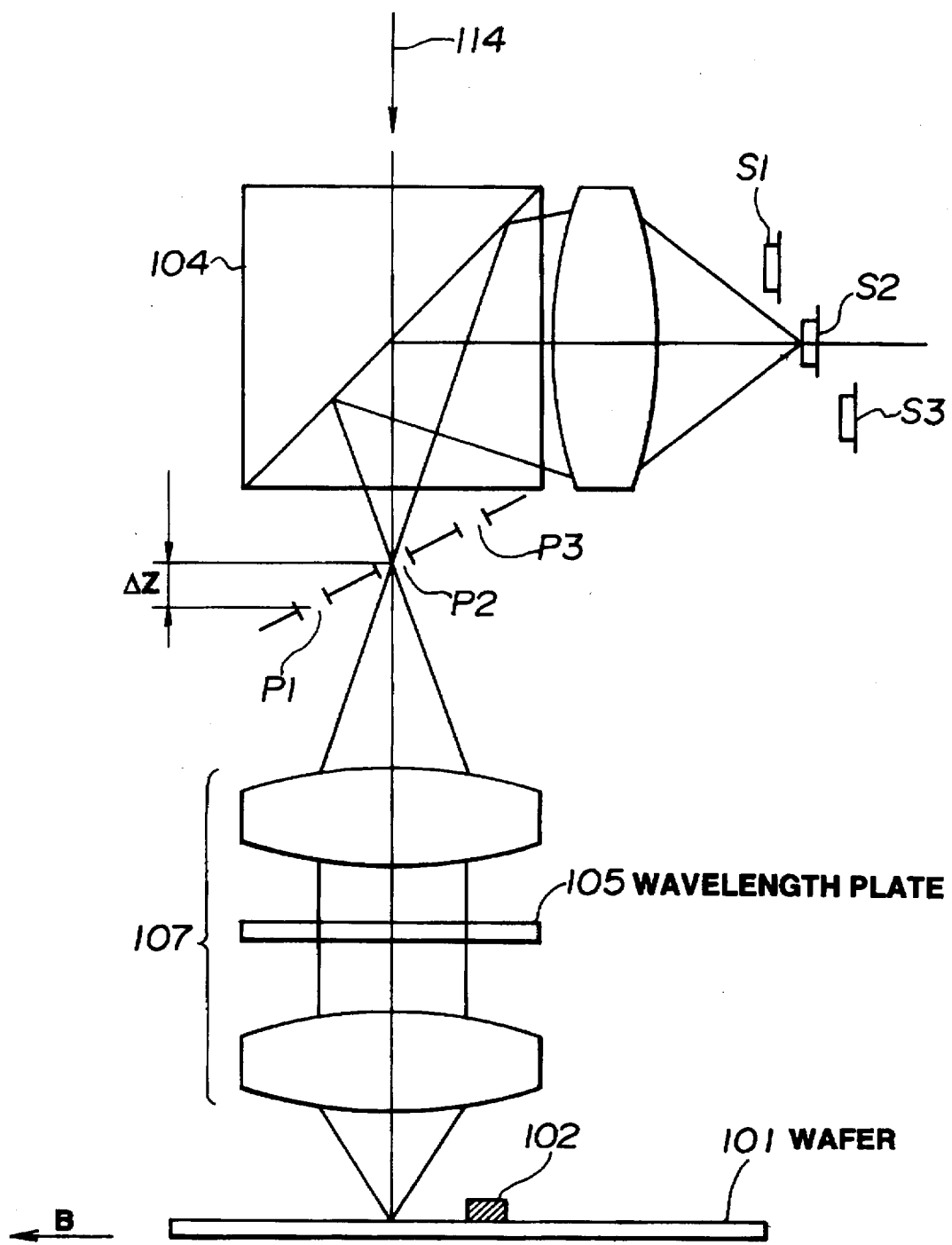
FIG. 25 is a diagram illustrating the details of a confocal optical system according to the present invention.

FIG. 25 illustrates the details of the confocal optical system of position detection system 111.

In FIG. 25, only the P-polarized component of illuminating light 114 is transmitted through polarizing beam splitter 104 to illuminate pinholes P1, P2 and P3. These three pinholes are disposed by being shifted by Δ Z from each other in the direction of the optical axis. The light beams passing through pinholes P1, P2 and P3 are reflected by wafer 101 after passing through optical system 107, again pass through pinholes P1, P2 and P3. The light beams, which have become S-polarized light by wavelength plate 105, are reflected by beam splitter 104, and are sensed by photoelectric transducers S1, S2 and S3, respectively.

At that time, if the imaging magnification of optical system 107 is represented by β, the amount of shift $\Delta Z_w$ of conjugate planes of pinholes P1, P2 and P3 in the direction of the optical axis at the side of the wafer is expressed by:

$$\Delta Z_w = \Delta Z/\beta^2 \quad (4)$$

If wafer 101 is moved in the direction of the arrow B for the purpose of exposure, reflected light from alignment mark 102 first passes through pinhole P1. If wafer 101 is further moved, the reflected light sequentially passes through pinholes P2 and P3.

In this configuration, since wafer 101 is moved in the direction of the optical axis so that pinhole P2 is on a surface optically conjugate with wafer 101, pinhole P1 transmits light from a plus defocus surface (the lower side in FIG. 25), and pinhole P3 transmits light from a minus defocus surface. These light beams are individually sensed by photoelectric transducers S1, S2 and S3.

Figure 26:
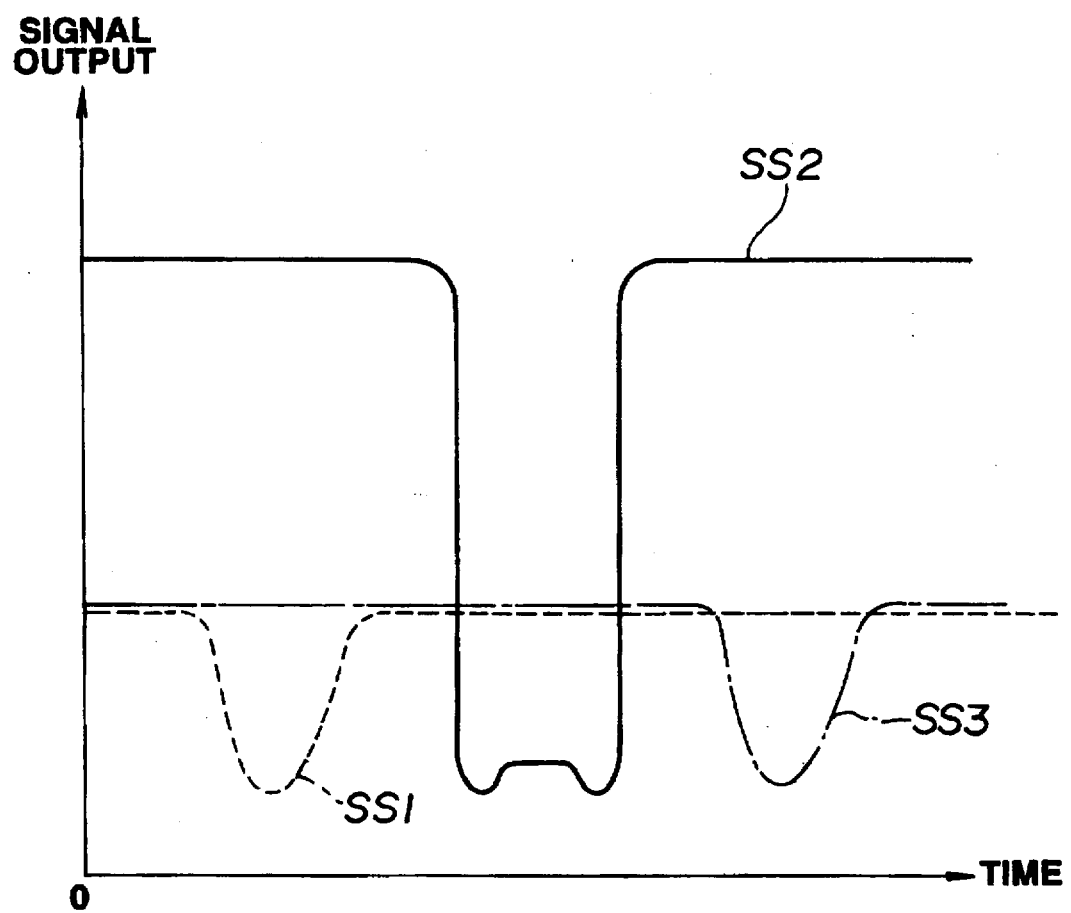
FIG. 26 is a diagram illustrating the waveform of a signal detected by a position detection system according to the present invention.

FIG. 26 illustrates signal waveforms at that time.

In FIG. 26, signal waveforms SS1, SS2 and SS3 correspond to signals from photoelectric transducers S1, S2 and S3, respectively. Since wafer 101 and pinhole P2 are optically conjugate, signal waveform SS2 at that time has the highest contrast. In this example, since $\Delta Z_w$ has a value 1000 nm which is greater than the amount of the 500 nm step of the alignment mark on the wafer, the contrasts of signal waveforms SS1 and SS3 are low, as shown in FIG. 26.

As described above, information relating to a plurality of surfaces of the step of the alignment mark is detected while separating information of each of the surfaces, the position of the alignment mark is determined by automatically selecting a signal to be used in position detection by the processing system 114 shown in FIG. 24 based on the information which is closest to the desired value, in consideration of at least one of the following information items. For example, two signal waveforms are selected in the sequence of higher contrast. Thereafter, the position of the alignment mark is determined by selecting one of the two signal waveforms having better symmetry.

(1) The thickness of the resist
(2) The amount of the step of the alignment mark
(3) The contrast of each signal waveform
(4) The symmetry of each signal waveform A plurality of items may, of course, be selected, and the average of the positions determined based on the respective items may be made to be the target position. Alternatively, the average of the signal waveforms may be calculated to obtain the position.

Although in the above-described fourth embodiment, signals from three pinholes are utilized for obtaining information relating to a plurality of planes, the same effects may also be obtained when a single pinhole is provided and the wafer is moved under the detection system a plurality of times at different positions in the direction of the optical axis.

Figure 27:
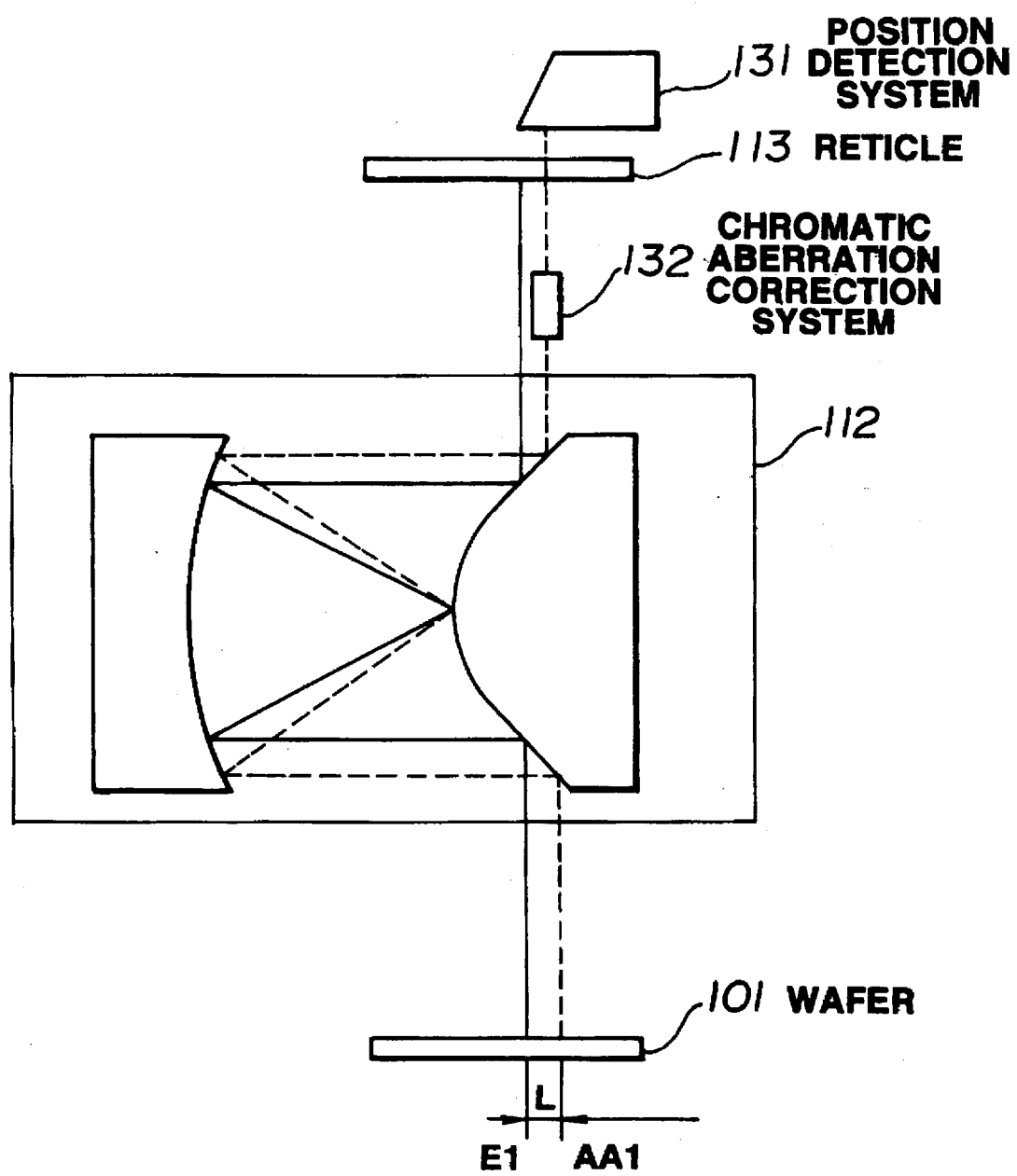
FIG. 27 is a diagram illustrating the schematic configuration of a principal portion of an apparatus according to a fifth embodiment of the present invention.

FIG. 27 is a diagram illustrating the schematic configuration of a principal portion of a position detection system applied to a TTL/TTR (through the reticle) approach according to a fifth embodiment of the present invention.

Chromatic-aberration correction system 132 is necessary when an aberration is present in the alignment wavelength in the projection optical system. This method has been proposed and executed by the assignee of the present application (JP 3-61802).

Figure 28:
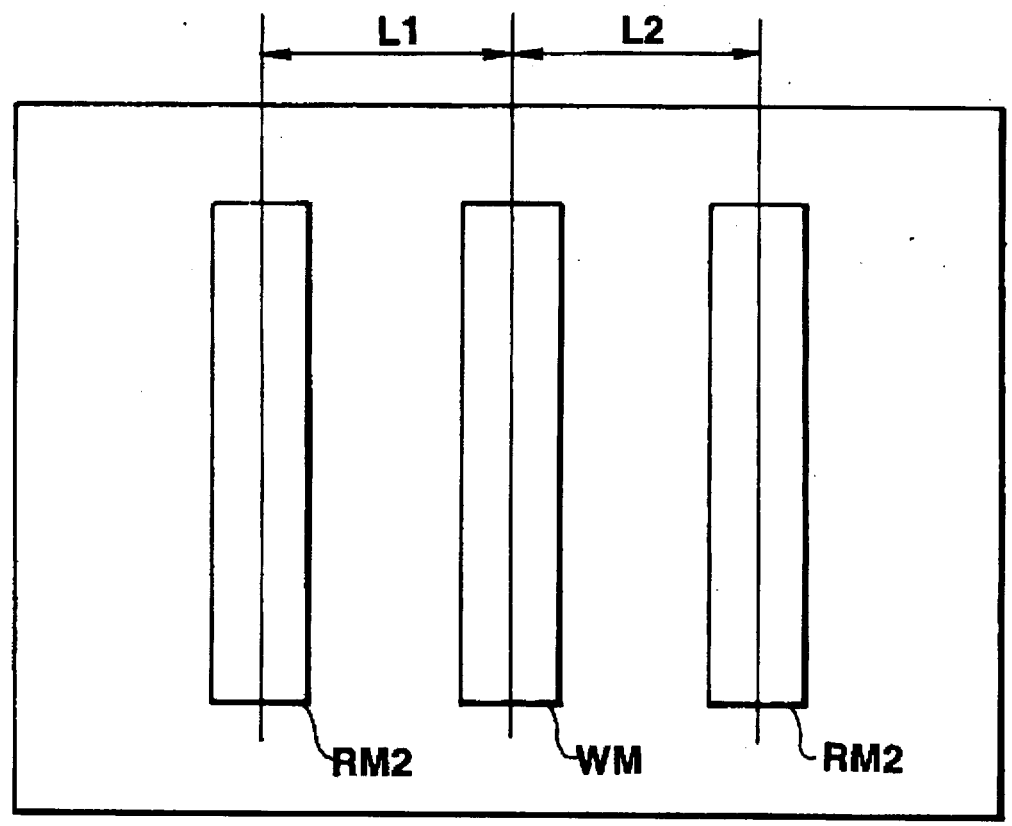
FIG. 28 is a diagram illustrating a state in which alignment marks on a reticle and on a wafer are adjusted with each other.

FIG. 28 illustrates a state of superposition between marks on a wafer and on a reticle. Reticle marks RM1 and RM2 are present in transparent portions not having Cr on the reticle, and the image of wafer mark WM is present between the images of the reticle marks. When intervals L1 and L2 between respective adjacent images become equal, correct alignment is realized.

Referring again to FIG. 27, by disposing position detection system 131 at a position where the wafer and the reticle mark can be observed before exposure, die-by-die alignment can be performed as in the case of the non-TTL approach. Furthermore, by having a processing system in which alignment is completed before exposure, a high throughput can be obtained.

Figure 29:
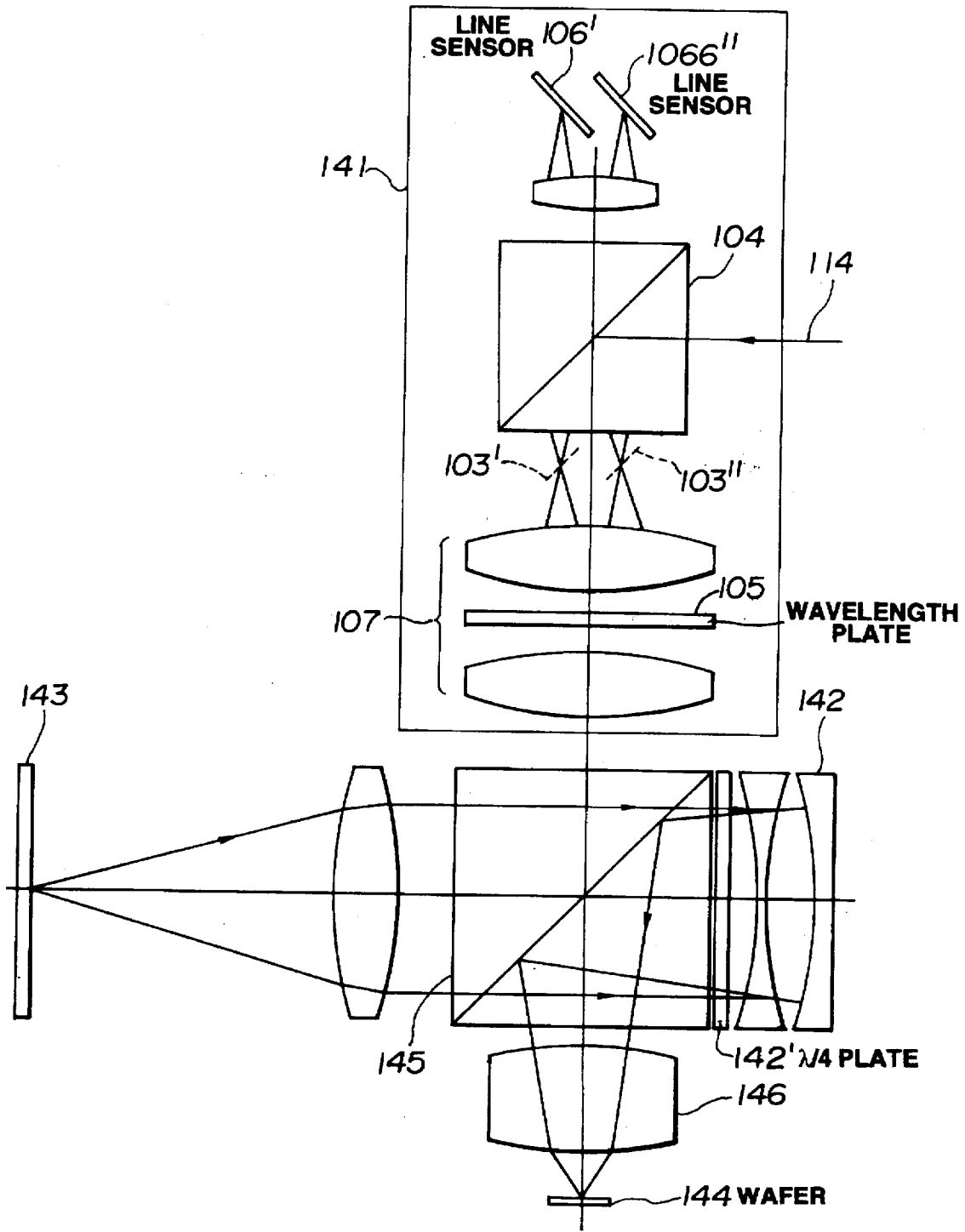
FIG. 29 is a diagram illustrating the schematic configuration of a principal portion of an apparatus according to a sixth embodiment of the present invention.

FIG. 29 is a diagram illustrating the schematic configuration of a principal portion of a position detection system, which is a TTL system but is not a TTR system, according to a sixth embodiment of the present invention.

The position detection method in this case is the same as in the above-described two embodiments except that position detection of the reticle is not performed.

FIG. 29 illustrates a case in which a catadioptric optical system is used in order to expose a pattern on a reticle onto the surface of a wafer.

One of two kinds of optical elements for exposure light, i.e., a half-mirror and a polarizing beam splitter, may be used as prism 145. When using a polarizing beam splitter, a λ/4 plate 142' must be disposed between reflecting mirror 142 and prism 145. Prism 145 only transmits light having the wavelength (alignment wavelength) used in position detection system 141.

Aberration at the alignment wavelength generated in lens system 146 between prism 145 and wafer 144 is corrected by optical system 107 of the position detection system. Pinhole groups 103' and 103", each having a plurality of pinholes in the direction of the optical axis, and wafer 144 are arranged to be surfaces substantially optically conjugate with each other. Only the S-polarized component of illuminating light 114 incident upon polarizing beam splitter 104 is reflected to illuminate pinhole groups 103' and 103". The light beams passing through pinhole groups 103' and 103" are reflected by wafer 144 after passing through optical system 107, and again pass through pinhole groups 103' and 103". The light beams, which have become P-polarized light by wavelength plate 105, pass through beam splitter 104, and are sensed by line sensors 106' and 106", such as one-dimensional CCD's. Thus, the object of the present invention is achieved. In this case, respective pinholes in pinhole groups 103' and 103" are optically conjugate with corresponding photocells of one-dimensional line sensors 106' and 106". It is thereby possible to obtain positional information relating the wafer on a plurality of surfaces in the direction of the optical axis.

The two pinhole groups and two line sensors are provided so that position detection can be performed before exposure no matter whether the moving direction of the wafer for exposure is the direction of arrow L or the direction of arrow R shown in FIG. 29.

In order to perform position detection only in one direction, pinhole groups 103' and 103" may be long in a direction orthogonal to the direction of measurement, such as gratings.

When the moving direction of the wafer for exposure is only one direction, the wafer must be moved only for alignment for position detection in another direction. Means for driving the detection system in that direction may, of course, be provided so that position detection is performed while the wafer is not moved.

Next, a description will be provided of a semiconductor-device manufacturing method which utilizes one of the above-described position detection apparatuses.

Figure 30:
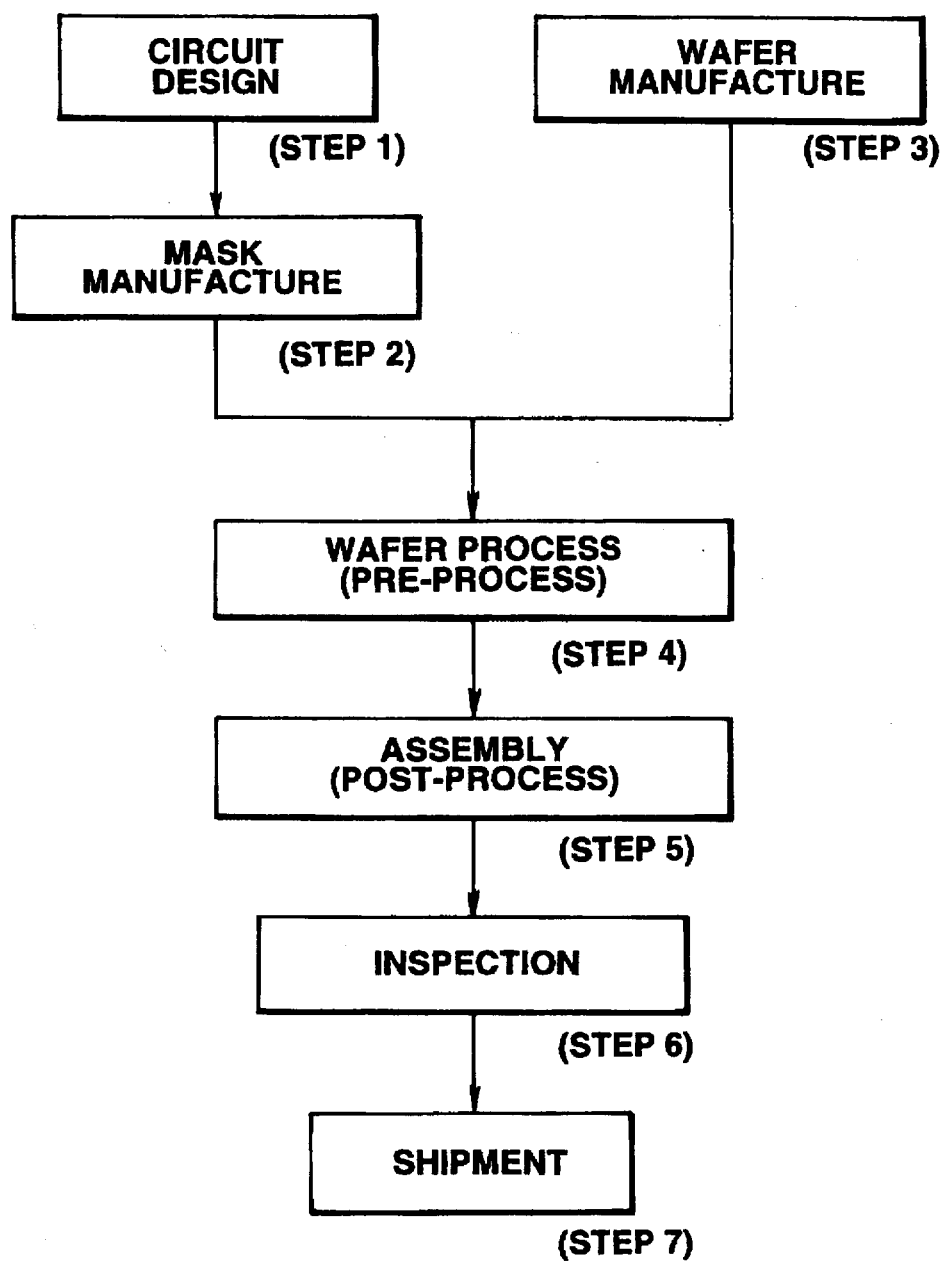
FIG. 30 is a diagram illustrating the manufacture flow of semiconductor devices.

FIG. 30 shows a flow for manufacturing semiconductor devices (semiconductor chips of IC's (integrated circuits), LSI's (large-scale integrated circuits) or the like, liquid crystal panels, CCD's or the like). In step 1 (circuit design), circuit design of semiconductor devices is performed. In step 2 (mask manufacture), masks on which designed circuit patterns are formed are manufactured. In step 3 (wafer manufacture), wafers are manufactured using a material such as silicon or the like. Step 4 (wafer process) is called a pre-process, in which actual circuits are formed on the wafers by means of photolithography using the above-described masks and wafers. The next step 5 (assembly process) is called a post-process which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 31:
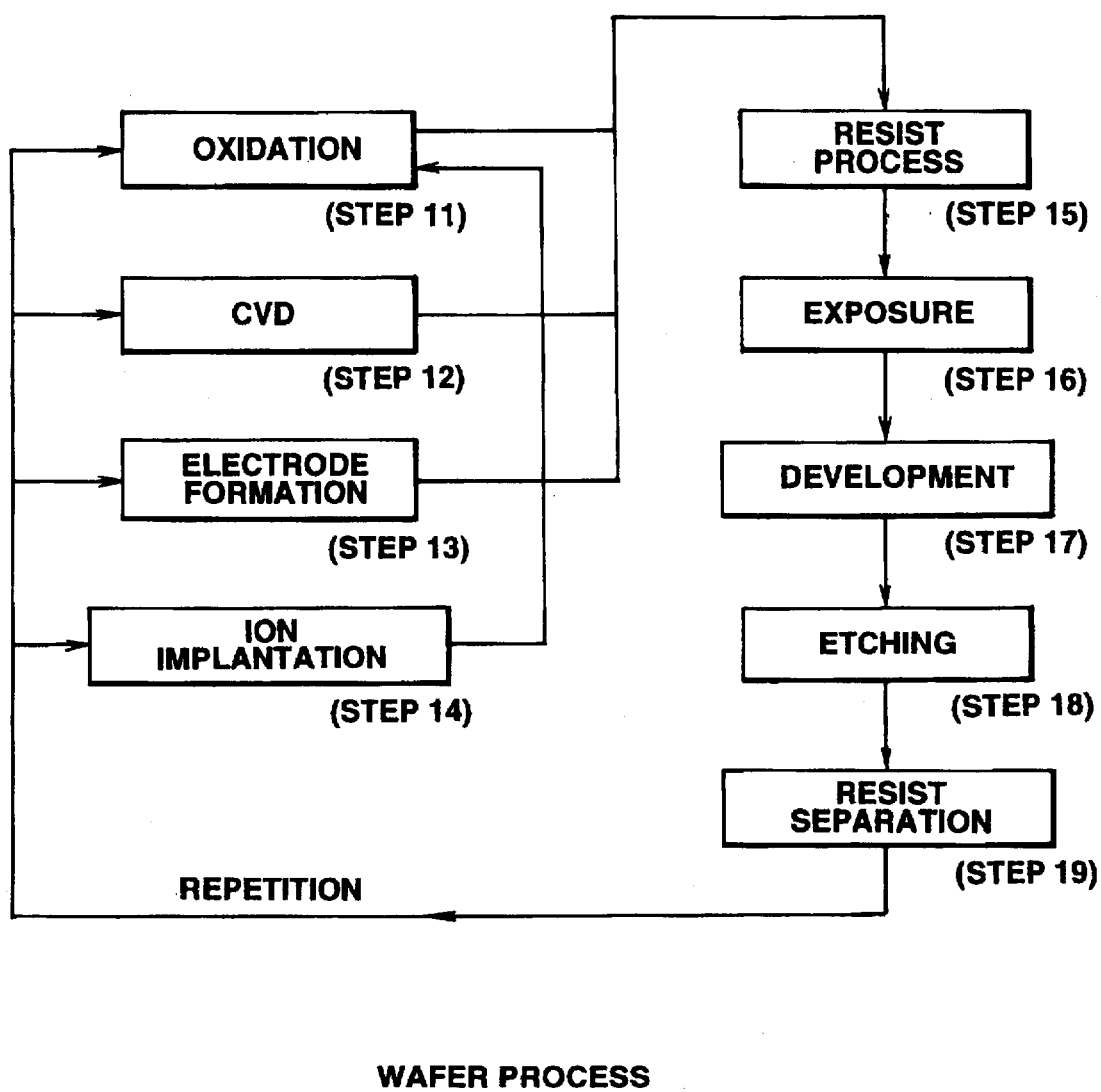
FIG. 31 is a diagram illustrating the detailed flow of a wafer process.

FIG. 31 shows the detailed flow of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16

(exposure), the circuit pattern on the mask is exposed and printed on the wafer by an exposure apparatus including one of the above-described position detection apparatuses. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer.

By using the manufacturing method of the present embodiment, it is possible to manufacture semiconductor devices with a high degree of integration which have previously been difficult to manufacture.

The individual components shown in outline or designated by blocks in the drawings are all well known in the position detection apparatus arts and their specific construction and operation are not critical to the operation or best mode for carrying out the invention.

While the present invention has been described with respect to what is presently considered to be the preferred embodiments, it is to be understood that the invention is not limited to the disclosed embodiments. To the cotrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A position detection apparatus for detecting a position of a flat object, said apparatus comprising:
   a mark having at least one of (i) projections and (ii) recesses formed on a surface of the object;
   an autofocus detection system for detecting, along a direction perpendicular to the surface of the object, the position of the surface of the object and for producing a detection output;
   a confocal optical system for observing an image of the mark within a focus plane of said optical system; and
   a control system for moving a predetermined reference plane with respect to the surface of the object into the focus plane of said confocal optical system in response to the output of said autofocus detection optical system and for causing said confocal optical system to detect the position of the mark in a direction parallel to the surface of the object.

2. An apparatus according to claim 1, wherein said confocal optical system has a field stop disposed such that said field stop and the predetermined plane are optically conjugate with each other.

3. An apparatus according to claim 2, wherein said field stop has the shape of a slit extending in a direction orthogonal to a direction of position detection of said mark.

4. An apparatus according to claim 2, further comprising means for performing relative movement between said field stop and the object in a direction of position detection of said marks.

5. An apparatus according to claim 2, wherein said field stop comprises a liquid-crystal-array shutter.

6. An apparatus according to claim 2, wherein said confocal optical system has an optical axis, and further comprising means for moving said field stop in a direction of the optical axis of said confocal optical system.

7. An apparatus according to claim 1, wherein said control system comprises storing means for storing step information of said at least one of the (i) projections and (ii) recesses, and wherein said control system utilizes said stored step information to determine the position of the predetermined plane.

8. A position detection apparatus for detecting a position of a flat object, said apparatus comprising:
   a mark having at least one of (i) projections and (ii) recesses formed on a surface of the object;
   a confocal optical system for detecting a position, in a direction parallel to the surface of the object, of said mark within a focus plane of said optical system, wherein said confocal optical system has a plurality of focus planes, and respectively detects positional information of said mark within each of the focus planes; and
   a control system for selecting a subset of positional information from the detected positional information and for determining positions of said mark from the selected subset of positional information.

9. An apparatus according to claim 8, wherein said confocal optical system has a field stop disposed such that said field stop and at least one of the predetermined planes are optically conjugate with each other.

10. An apparatus according to claim 9, further comprising means for moving the object in a direction perpendicular to the surface of the object.

11. An apparatus according to claim 9, wherein said confocal optical system comprises a plurality of field stops corresponding to the plurality of focus planes, and wherein each of the plurality of field stops and the corresponding one of the plurality of predermined surfaces are optically conjugate with each other.

12. An apparatus according to claim 11, further comprising means for performing relative movement between the field stops and the object in a direction of position detection of said mark.

13. An apparatus according to claim 8, wherein said control system selects the subset of positional information based on a contrast of images of said mark.

14. A position detection method for detecting a position of a flat object, said method comprising the steps of:
   forming a mark having at least one of (i) projections and (ii) recesses on a surface of the object;
   detecting, along a direction perpendicular to the surface of the object, the position of the surface of the object using an autofocus detection system and producing a detection output;
   observing, using a confocal optical system, an image of the mark within a focus plane of the optical system; and
   moving, using a control system, a predetermined reference plane with respect to the surface of the object into the focus plane of the confocal optical system in response to the output of the autofocus detection system and causing the confocal optical system to detect the position of the mark in a direction parallel to the surface of the object.

15. A method according to claim 14, wherein the confocal optical system has a field stop, and wherein the field stop and the predetermined plane are optically conjugate with each other.

16. A method according to claim 15, wherein the field stop has the shape of a slit extending in a direction orthogonal to a direction of position detection of the mark.

17. A method according to claim 15, further comprising the step of relatively moving the field stop and the object in the direction of position detection of the mark.

18. A method according to claim 15, wherein the field stop comprises a liquid-crystal-array shutter.

19. A method according to claim 15, further comprising the step of moving the field stop in the direction of the optical axis of the confocal optical system.

20. A method according to claim 14, wherein the confocal optical system detects the position of the mark utilizing predetermined step information of said at least one of the (i) projections and (ii) recesses for forming the mark.

21. A position detection method for detecting a position of a flat object, sid method comprising the steps of:

forming a mark having at least one of (i) projections and (ii) recesses on a surface of the object;

detecting, using a confocal optical system, a position, in a direction parallel to the surface of the object, of the mark within a focus plane of the optical system, wherein the confocal optical system has a plurality of focus planes, and further comprising respectively detecting positional information of the mark within each of the focus planes; and selecting, using a control system, a subset of positional information from the detected positional information and determining, using the control system, positions of the mark from the selected subset of positional information.

22. A method according to claim 21, wherein the confocal optical system has a field stop, and wherein the field stop and at least one of the predetermined planes are optically conjugate with each other.

23. A method according to claim 22, further comprising the step of moving the object in a direction perpendicular to the surface of the object.

24. A method according to claim 22, further comprising providing a plurality of field stops of the confocal optical system corresponding to the plurality of predetermined planes, and positioning each of the plurality of field stops and the corresponding one of the plurality of focus planes optically conjugate with each other.

25. A method according to claim 24, further comprising the step of relatively moving the field stops and the object in the direction of position detection of the mark.

26. A method according to claim 21, wherein said selecting step comprises the step of selecting the subset of positional information based on contrast of images of the mark.

27. An exposure apparatus for detecting positions of a mark formed on a wafer, and for projecting and exposing a pattern formed on a reticle onto the wafer, said apparatus comprising:

a movable stage for mounting the wafer;

a mark having at least one of (i) projections and (ii) recesses formed on a surface of the wafer;

an autofocus detection system for detecting, along a direction perpendicular to the surface of the object, the position of the surface of the wafer and for producing a detection output;

a confocal optical system for observing an image of the mark within a focus plane of said optical system;

a control system for moving a predetermined reference plane with respect to the surface of the object into the focus plane of said confocal optical system in response to the output of said autofocus detection optical system and for causing said confocal optical system to detect the position of the mark in a direction parallel to the surface of the object; and means for projecting and exposing the pattern formed on the reticle onto the wafer.

28. An exposure apparatus for detecting positions of a mark formed on a wafer, and for projecting and exposing a pattern formed on a reticle onto the wafer, said apparatus comprising:

a movable stage for mounting the wafer;

a mark having at least one of (i) projections and (ii) recesses formed on a surface of the wafer;

a confocal optical system for detecting a position, in a direction parallel to the surface of the object, of said mark within a focus plane of said optical system, wherein said confocal optical system has a plurality of focus planes, and respectively detects positional information of said mark within each of the focus planes;

a control system for selecting a subset of positional information from the detected positional information and for determining positions of the mark from the selected subset of positional information; and means for projecting and exposing the pattern formed on the reticle onto the wafer.

29. A method for manufacturing semiconductor devices by detecting positions of a mark formed on a wafer, and by projecting and exposing a pattern formed on a reticle onto the wafer, said method comprising the steps of:

forming a mark having at least one of (i) projections and (ii) recesses on a surface of the wafer;

detecting, along a direction perpendicular to the surface of the wafer, the position of the surface of the wafer using an autofocus detection system, and producing a detection output;

observing, using a confocal optical system, an image of the mark within a focus plane of the optical system; and moving, using a control system, a predetermined reference plane with respect to the surface of the object into the focus plane of the confocal optical system in response to the output of the autofocus detection optical system and causing the confocal optical system to detect the position of the mark in a direction parallel to the surface of the object moving the wafer to a predetermined position based on the detection of the mark by the confocal optical system; and projecting and exposing the pattern formed on the reticle onto the wafer.

30. A method for manufacturing semiconductor devices by detecting positions of a mark formed on a wafer, and by projecting and exposing a pattern formed on a reticle onto the wafer, said method comprising the steps of:

forming a mark having at least one of (i) projections and (ii) recesses on a surface of the wafer;

detecting, using a confocal optical system, a position, in a direction parallel to the surface of the object, of the mark within a focus plane of the optical system, wherein the confocal optical system has a plurality of focus planes, and further comprising respectively detecting positional information of the mark within each of the focus planes;

selecting, using a control system, a subset of positional information from the detected positional information and determining, using the control system, positions of the mark from the selected subset of positional information;

moving the wafer to a predetermined position based on the positions of the mark determined in said determining step; and projecting and exposing the pattern formed on the reticle onto the wafer.

* * * * *

UNITED STATES PATENT AND TRADEMARK OFFICE
CERTIFICATE OF CORRECTION

PATENT NO. : 5,659,384
DATED : August 19, 1997
INVENTOR(S) : HIDEKI INA

It is certified that error appears in the above-indentified patent and that said Letters Patent is hereby corrected as shown below:

COLUMN 2

Line 59, "signal $0S_v$" should read --signal $S_v$--.

COLUMN 7

Line 40, "distance $Z_0$" should read --distance Zo--; and
    Line 46, "Z0+T/N" should read --Zo+T/N--.

COLUMN 9

Line 48, "State" should read --state--.

COLUMN 10

Line 62, "measurment" should read --measurement--.

COLUMN 12

Line 40, "$2.0^2/0.03=6.67 \geq V_z(\mu m/sec)$." should read --$2.0/0.03=6.67 \geq V_z(\mu m/sec)$.--

UNITED STATES PATENT AND TRADEMARK OFFICE
CERTIFICATE OF CORRECTION

PATENT NO. : 5,659,384
DATED : August 19, 1997
INVENTOR(S) : HIDEKI INA

It is certified that error appears in the above-indentified patent and that said Letters Patent is hereby corrected as shown below:

COLUMN 19

Line 6, "sid" should read --said--.

COLUMN 20

Line 28, "and" should be deleted; and
Line 35, "object" should read --object;--.

Signed and Sealed this

Twenty-first Day of April, 1998

Attest:

BRUCE LEHMAN

Attesting Officer

Commissioner of Patents and Trademarks